United States Patent
Raponi et al.

(10) Patent No.: US 10,050,843 B2
(45) Date of Patent: Aug. 14, 2018

(54) GENERATION OF NETWORK-ON-CHIP LAYOUT BASED ON USER SPECIFIED TOPOLOGICAL CONSTRAINTS

(71) Applicant: NetSpeed Systems, San Jose, CA (US)

(72) Inventors: Pier Giorgio Raponi, San Jose, CA (US); Eric Norige, San Jose, CA (US); Sailesh Kumar, San Jose, CA (US)

(73) Assignee: NetSpeed Systems, San Jose, CA (US)

( * ) Notice: Subject to any disclaimer, the term of this patent is extended or adjusted under 35 U.S.C. 154(b) by 572 days.

(21) Appl. No.: 14/625,132

(22) Filed: Feb. 18, 2015

(65) Prior Publication Data

US 2017/0063639 A1 Mar. 2, 2017

(51) Int. Cl.
*H04L 12/24* (2006.01)
*G06F 17/50* (2006.01)

(52) U.S. Cl.
CPC ............ *H04L 41/145* (2013.01); *G06F 17/50* (2013.01); *H04L 41/12* (2013.01)

(58) Field of Classification Search
CPC ........ H04L 41/145; H04L 41/12; G06F 17/50
See application file for complete search history.

(56) References Cited

U.S. PATENT DOCUMENTS

| | | | |
|---|---|---|---|
| 4,409,838 A | 10/1983 | Schomberg | |
| 4,933,933 A | 6/1990 | Daily et al. | |
| 5,105,424 A | 4/1992 | Flaig et al. | |
| 5,163,016 A | 11/1992 | Har'El et al. | |
| 5,355,455 A | 10/1994 | Hilgendorf et al. | |
| 5,432,785 A | 7/1995 | Ahmed et al. | |
| 5,583,990 A | 12/1996 | Birrittella et al. | |
| 5,588,152 A | 12/1996 | Dapp et al. | |
| 5,764,740 A | 6/1998 | Holender | |
| 5,859,981 A | 1/1999 | Levin et al. | |
| 5,991,308 A | 11/1999 | Fuhrmann et al. | |
| 6,003,029 A | 12/1999 | Agrawal et al. | |
| 6,029,220 A | 2/2000 | Iwamura et al. | |
| 6,058,385 A | 5/2000 | Koza et al. | |
| 6,101,181 A | 8/2000 | Passint et al. | |

(Continued)

FOREIGN PATENT DOCUMENTS

| | | |
|---|---|---|
| CN | 103684961 A | 3/2014 |
| KR | 10-2013-0033898 A1 | 4/2013 |

(Continued)

OTHER PUBLICATIONS

Jalabert et al.; "A tool for instantiating application specific Networks on Chip"; Proceedings of the Design, Automation and Test in Europe Conference and Exhibition; IEEE; 2004; pp. 1-6.*

(Continued)

*Primary Examiner* — Naum B Levin
(74) *Attorney, Agent, or Firm* — Procopio, Cory, Hargreaves and Savitch LLP

(57) ABSTRACT

In an aspect, the present disclosure provides a method that comprises automatic generation of a NoC from specified topological information based on projecting NoC elements of the NoC onto a grid layout. In an aspect, the specified topological information, including specification of putting constraints on positions/locations of NoC elements and links thereof, can be input by a user in real space, and can then be projected on the grid layout.

2 Claims, 21 Drawing Sheets

(56) References Cited

U.S. PATENT DOCUMENTS

| | | | |
|---|---|---|---|
| 6,108,739 A | 8/2000 | James et al. | |
| 6,249,902 B1 | 6/2001 | Igusa et al. | |
| 6,314,487 B1 | 11/2001 | Hahn et al. | |
| 6,415,282 B1 | 7/2002 | Mukherjea et al. | |
| 6,526,451 B2* | 2/2003 | Kasper | G06F 5/065 |
| | | | 370/359 |
| 6,674,720 B1 | 1/2004 | Passint et al. | |
| 6,711,717 B2 | 3/2004 | Nystrom et al. | |
| 6,925,627 B1 | 8/2005 | Longway et al. | |
| 6,967,926 B1 | 11/2005 | Williams, Jr. et al. | |
| 6,983,461 B2 | 1/2006 | Hutchison et al. | |
| 7,007,095 B2* | 2/2006 | Chen | H04L 47/10 |
| | | | 709/230 |
| 7,046,633 B2 | 5/2006 | Carvey | |
| 7,065,730 B2 | 6/2006 | Alpert et al. | |
| 7,143,221 B2 | 11/2006 | Bruce et al. | |
| 7,318,214 B1 | 1/2008 | Prasad et al. | |
| 7,379,424 B1 | 5/2008 | Krueger | |
| 7,424,698 B2* | 9/2008 | Honary | G06F 17/5045 |
| | | | 716/103 |
| 7,437,518 B2 | 10/2008 | Tsien | |
| 7,461,236 B1 | 12/2008 | Wentzlaff | |
| 7,509,619 B1 | 3/2009 | Miller et al. | |
| 7,564,865 B2 | 7/2009 | Radulescu | |
| 7,590,959 B2 | 9/2009 | Tanaka | |
| 7,598,766 B2* | 10/2009 | Mercaldi-Kim | H03K 19/177 |
| | | | 326/28 |
| 7,626,983 B2* | 12/2009 | Rhee | G06F 17/5068 |
| | | | 370/386 |
| 7,693,064 B2 | 4/2010 | Thubert et al. | |
| 7,724,735 B2 | 5/2010 | Locatelli et al. | |
| 7,725,859 B1 | 5/2010 | Lenahan et al. | |
| 7,774,783 B2 | 8/2010 | Toader | |
| 7,808,968 B1 | 10/2010 | Kalmanek, Jr. et al. | |
| 7,853,774 B1 | 12/2010 | Wentzlaff | |
| 7,917,885 B2 | 3/2011 | Becker | |
| 7,957,381 B2 | 6/2011 | Clermidy et al. | |
| 7,973,804 B2 | 7/2011 | Mejdrich et al. | |
| 8,018,249 B2* | 9/2011 | Koch | G06F 15/7867 |
| | | | 326/38 |
| 8,020,168 B2 | 9/2011 | Hoover et al. | |
| 8,042,087 B2* | 10/2011 | Murali, Sr. | G06F 17/5045 |
| | | | 370/235 |
| 8,050,256 B1 | 11/2011 | Bao et al. | |
| 8,059,551 B2 | 11/2011 | Milliken | |
| 8,099,757 B2 | 1/2012 | Riedle et al. | |
| 8,136,071 B2 | 3/2012 | Solomon | |
| 8,203,938 B2 | 6/2012 | Gibbings | |
| 8,261,025 B2 | 9/2012 | Mejdrich et al. | |
| 8,270,316 B1* | 9/2012 | Chang | G06F 15/7825 |
| | | | 370/254 |
| 8,281,297 B2 | 10/2012 | Dasu et al. | |
| 8,306,042 B1 | 11/2012 | Abts | |
| 8,312,402 B1 | 11/2012 | Okhmatovski et al. | |
| 8,327,031 B2* | 12/2012 | Lavigne | H04L 49/65 |
| | | | 709/250 |
| 8,352,774 B2 | 1/2013 | Elrabaa | |
| 8,407,425 B2 | 3/2013 | Gueron et al. | |
| 8,412,795 B2 | 4/2013 | Mangano et al. | |
| 8,448,102 B2 | 5/2013 | Kornachuk et al. | |
| 8,490,110 B2 | 7/2013 | Hoover et al. | |
| 8,492,886 B2 | 7/2013 | Or-Bach et al. | |
| 8,514,889 B2 | 8/2013 | Jayasimha | |
| 8,531,943 B2* | 9/2013 | Olofsson | G06F 15/17381 |
| | | | 370/229 |
| 8,541,819 B1 | 9/2013 | Or-Bach et al. | |
| 8,543,964 B2 | 9/2013 | Ge et al. | |
| 8,601,423 B1 | 12/2013 | Philip et al. | |
| 8,619,622 B2 | 12/2013 | Harrand et al. | |
| 8,635,577 B2 | 1/2014 | Kazda et al. | |
| 8,661,455 B2 | 2/2014 | Mejdrich et al. | |
| 8,667,439 B1 | 3/2014 | Kumar et al. | |
| 8,705,368 B1 | 4/2014 | Abts et al. | |
| 8,711,867 B2 | 4/2014 | Guo et al. | |
| 8,717,875 B2 | 5/2014 | Bejerano et al. | |
| 8,738,860 B1 | 5/2014 | Griffin et al. | |
| 8,793,644 B2 | 7/2014 | Michel et al. | |
| 8,798,038 B2 | 8/2014 | Jayasimha et al. | |
| 8,819,616 B2* | 8/2014 | Philip | G06F 17/5072 |
| | | | 340/2.29 |
| 8,934,377 B2* | 1/2015 | Kumar | H04L 12/413 |
| | | | 370/254 |
| 9,054,977 B2* | 6/2015 | Kumar | H04L 41/12 |
| 9,130,856 B2* | 9/2015 | Kumar | H04L 47/125 |
| 9,160,627 B2* | 10/2015 | Kumar | H04L 49/109 |
| 9,225,545 B2* | 12/2015 | Archer | H04L 12/413 |
| 9,344,358 B2* | 5/2016 | Bhardwaj | H04L 45/021 |
| 9,473,388 B2* | 10/2016 | Kumar | H04L 45/16 |
| 9,479,456 B2* | 10/2016 | Hutton | H04L 49/109 |
| 9,590,813 B1* | 3/2017 | Kumar | H04L 45/16 |
| 2002/0071392 A1 | 6/2002 | Grover et al. | |
| 2002/0073380 A1 | 6/2002 | Cooke et al. | |
| 2002/0083159 A1 | 6/2002 | Ward et al. | |
| 2002/0095430 A1 | 7/2002 | Egilsson et al. | |
| 2003/0088602 A1 | 5/2003 | Dutta et al. | |
| 2003/0145314 A1 | 7/2003 | Nguyen et al. | |
| 2004/0049565 A1 | 3/2004 | Keller et al. | |
| 2004/0216072 A1 | 10/2004 | Alpert et al. | |
| 2005/0147081 A1 | 7/2005 | Acharya et al. | |
| 2005/0203988 A1 | 9/2005 | Nollet et al. | |
| 2006/0031615 A1 | 2/2006 | Bruce et al. | |
| 2006/0075169 A1 | 4/2006 | Harris et al. | |
| 2006/0161875 A1 | 7/2006 | Rhee | |
| 2006/0209846 A1 | 9/2006 | Clermidy et al. | |
| 2006/0268909 A1 | 11/2006 | Langevin et al. | |
| 2007/0038987 A1 | 2/2007 | Ohara et al. | |
| 2007/0088537 A1 | 4/2007 | Lertora et al. | |
| 2007/0118320 A1 | 5/2007 | Luo et al. | |
| 2007/0147379 A1 | 6/2007 | Lee et al. | |
| 2007/0162903 A1 | 7/2007 | Babb, II et al. | |
| 2007/0244676 A1 | 10/2007 | Shang et al. | |
| 2007/0256044 A1 | 11/2007 | Coryer et al. | |
| 2007/0267680 A1 | 11/2007 | Uchino et al. | |
| 2007/0274331 A1 | 11/2007 | Locatelli et al. | |
| 2008/0072182 A1 | 3/2008 | He et al. | |
| 2008/0120129 A1 | 5/2008 | Seubert et al. | |
| 2008/0126569 A1 | 5/2008 | Rhim et al. | |
| 2008/0184259 A1 | 7/2008 | Lesartre et al. | |
| 2008/0186998 A1 | 8/2008 | Rijpkema | |
| 2008/0211538 A1 | 9/2008 | Lajolo et al. | |
| 2008/0232387 A1 | 9/2008 | Rijpkema et al. | |
| 2009/0037888 A1 | 2/2009 | Tatsuoka et al. | |
| 2009/0046727 A1 | 2/2009 | Towles | |
| 2009/0070726 A1 | 3/2009 | Mehrotra et al. | |
| 2009/0122703 A1 | 5/2009 | Gangwal et al. | |
| 2009/0172304 A1 | 7/2009 | Gueron et al. | |
| 2009/0187716 A1 | 7/2009 | Comparan et al. | |
| 2009/0210184 A1 | 8/2009 | Medardoni et al. | |
| 2009/0231348 A1 | 9/2009 | Mejdrich et al. | |
| 2009/0268677 A1 | 10/2009 | Chou et al. | |
| 2009/0285222 A1 | 11/2009 | Hoover et al. | |
| 2009/0300292 A1 | 12/2009 | Fang et al. | |
| 2009/0313592 A1 | 12/2009 | Murali et al. | |
| 2010/0040162 A1 | 2/2010 | Suehiro | |
| 2010/0158005 A1 | 6/2010 | Mukhopadhyay et al. | |
| 2010/0211718 A1 | 8/2010 | Gratz et al. | |
| 2011/0022754 A1 | 1/2011 | Cidon et al. | |
| 2011/0035523 A1 | 2/2011 | Feero et al. | |
| 2011/0060831 A1 | 3/2011 | Ishii et al. | |
| 2011/0072407 A1 | 3/2011 | Keinert et al. | |
| 2011/0085550 A1 | 4/2011 | Lecler et al. | |
| 2011/0103799 A1 | 5/2011 | Shacham et al. | |
| 2011/0154282 A1 | 6/2011 | Chang et al. | |
| 2011/0191774 A1 | 8/2011 | Hsu et al. | |
| 2011/0235531 A1 | 9/2011 | Vangal et al. | |
| 2011/0276937 A1 | 11/2011 | Waller | |
| 2011/0302345 A1 | 12/2011 | Boucard et al. | |
| 2011/0307734 A1 | 12/2011 | Boesen et al. | |
| 2011/0320854 A1 | 12/2011 | Elrabaa | |
| 2012/0022841 A1 | 1/2012 | Appleyard | |
| 2012/0023473 A1 | 1/2012 | Brown et al. | |
| 2012/0026917 A1 | 2/2012 | Guo et al. | |
| 2012/0079147 A1 | 3/2012 | Ishii et al. | |

(56) References Cited

U.S. PATENT DOCUMENTS

| | | |
|---|---|---|
| 2012/0099475 A1 | 4/2012 | Tokuoka |
| 2012/0110106 A1 | 5/2012 | De Lescure et al. |
| 2012/0110541 A1 | 5/2012 | Ge et al. |
| 2012/0155250 A1 | 6/2012 | Carney et al. |
| 2012/0173846 A1 | 7/2012 | Wang et al. |
| 2012/0209944 A1 | 8/2012 | Mejdrich et al. |
| 2013/0028090 A1 | 1/2013 | Yamaguchi et al. |
| 2013/0028261 A1 | 1/2013 | Lee |
| 2013/0051397 A1 | 2/2013 | Guo et al. |
| 2013/0054811 A1 | 2/2013 | Harrand |
| 2013/0080073 A1 | 3/2013 | de Corral |
| 2013/0103369 A1 | 4/2013 | Huynh et al. |
| 2013/0103912 A1 | 4/2013 | Jones et al. |
| 2013/0117543 A1 | 5/2013 | Venkataramanan et al. |
| 2013/0148506 A1 | 6/2013 | Lea |
| 2013/0151215 A1 | 6/2013 | Mustapha |
| 2013/0159944 A1 | 6/2013 | Uno et al. |
| 2013/0163615 A1 | 6/2013 | Mangano et al. |
| 2013/0174113 A1 | 7/2013 | Lecler et al. |
| 2013/0179613 A1 | 7/2013 | Boucard et al. |
| 2013/0191572 A1 | 7/2013 | Nooney et al. |
| 2013/0207801 A1 | 8/2013 | Barnes |
| 2013/0219148 A1 | 8/2013 | Chen et al. |
| 2013/0250792 A1 | 9/2013 | Yoshida et al. |
| 2013/0254488 A1 | 9/2013 | Kaxiras et al. |
| 2013/0263068 A1 | 10/2013 | Cho et al. |
| 2013/0268990 A1 | 10/2013 | Urzi et al. |
| 2013/0326458 A1 | 12/2013 | Kazda et al. |
| 2014/0068132 A1 | 3/2014 | Philip et al. |
| 2014/0068134 A1 | 3/2014 | Philip et al. |
| 2014/0092740 A1 | 4/2014 | Wang et al. |
| 2014/0098683 A1 | 4/2014 | Kumar et al. |
| 2014/0112149 A1 | 4/2014 | Urzi et al. |
| 2014/0115218 A1 | 4/2014 | Philip et al. |
| 2014/0115298 A1 | 4/2014 | Philip et al. |
| 2014/0126572 A1* | 5/2014 | Hutton .............. H04L 49/109 370/360 |
| 2014/0156929 A1* | 6/2014 | Falsafi ............... G06F 12/0813 711/122 |
| 2014/0211622 A1 | 7/2014 | Kumar et al. |
| 2014/0254388 A1 | 9/2014 | Kumar et al. |
| 2015/0341224 A1* | 11/2015 | van Ruymbeke ....... H04L 41/12 370/254 |
| 2017/0041249 A1* | 2/2017 | Hutton .............. H04L 49/109 |
| 2017/0118111 A1* | 4/2017 | Bandic ................. H04L 49/90 |

FOREIGN PATENT DOCUMENTS

| | | |
|---|---|---|
| WO | 2010074872 A1 | 7/2010 |
| WO | 2013063484 A1 | 5/2013 |
| WO | 2014059024 A1 | 4/2014 |

OTHER PUBLICATIONS

Abts, D., et al., Age-Based Packet Arbitration in Large-Radix k-ary n-cubes, Supercomputing 2007 (SC07), Nov. 10-16, 2007, 11 pgs.
Das, R., et al., Aergia: Exploiting Packet Latency Slack in On-Chip Networks, 37th International Symposium on Computer Architecture (ISCA '10), Jun. 19-23, 2010, 11 pgs.
Ebrahimi, E., et al., Fairness via Source Throttling: A Configurable and High-Performance Fairness Substrate for Multi-Core Memory Systems, ASPLOS '10, Mar. 13-17, 2010, 12 pgs.
Grot, B., Preemptive Virtual Clock: A Flexible, Efficient, and Cost-Effective QOS Scheme for Networks-on-Chip, Micro '09, Dec. 16, 2009, 12 pgs.
Grot, B., Kilo-NOC: A Heterogeneous Network-on-Chip Architecture for Scalability and Service Guarantees, ISCA '11, Jun. 4-8, 2011, 12 pgs.
Grot, B., Topology-Aware Quality-of-Service Support in Highly Integrated Chip Multiprocessors, 6th Annual Workshop on the Interaction between Operating Systems and Computer Architecture, Jun. 2006, 11 pgs.
Jiang, N., et al., Performance Implications of Age-Based Allocations in On-Chip Networks, CVA MEMO 129, May 24, 2011, 21 pgs.
Lee, J. W., et al., Globally-Synchronized Frames for Guaranteed Quality-of-Service in On-Chip Networks, 35th IEEE/ACM International Symposium on Computer Architecture (ISCA), Jun. 2008, 12 pgs.
Lee, M. M., et al., Approximating Age-Based Arbitration in On-Chip Networks, PACT '10, Sep. 11-15, 2010, 2 pgs.
Li, B. et al., CoQoS: Coordinating QoS-Aware Shared Resources in NoC-based SoCs, J. Parallel Distrib. Comput., 71(5), May 2011, 14 pgs.
International Search Report and Written Opinion for PCT/US2013/064140, dated Jan. 22, 2014, 9 pgs.
International Search Report and Written Opinion for PCT/US2014/012003, dated Mar. 26, 2014, 9 pgs.
International Search Report and Written Opinion for PCT/US2014/012012, dated May 14, 2014, 9 pgs.
Ababei, C., et al., Achieving Network on Chip Fault Tolerance by Adaptive Remapping, Parallel & Distributed Processing, 2009, IEEE International Symposium, 4 pgs.
Beretta, I, et al., A Mapping Flow for Dynamically Reconfigurable Multi-Core System-on-Chip Design, IEEE Transactions on Computer-Aided Design of Integrated Circuits and Systems, Aug. 2011, 30(8), pp. 1211-1224.
Gindin, R., et al., NoC-Based FPGA: Architecture and Routing, Proceedings of the First International Symposium on Networks-on-Chip (NOCS'07), May 2007, pp. 253-262.
Yang, J., et al., Homogeneous NoC-based FPGA: The Foundation for Virtual FPGA, 10th IEEE International Conference on Computer and Information Technology (CIT 2010), Jun. 2010, pp. 62-67.
International Search Report and Written Opinion for PCT/US2014/023625, dated Jul. 10, 2014, 9 pgs.
International Search Report and Written Opinion for PCT/US2014/037902, dated Sep. 30, 2014, 14 pgs.
International Search Report and Written Opinion for PCT/US2014/048190, dated Nov. 28, 2014, 11 pgs.
Hestness, J., et al., Netrace: Dependency-Tracking for Efficient Network-on-Chip Experimentation, The University of Texas at Austin, Dept. of Computer Science, May 2011, 20 pgs.
Lin, S., et al., Scalable Connection-Based Flow Control Scheme for Application-Specific Network-on-Chip, The Journal of China Universities of Posts and Telecommunications, Dec. 2011, 18(6), pp. 98-105.
Munirul, H.M., et al., Evaluation of Multiple-Valued Packet Multiplexing Scheme for Network-on-Chip Architecture, Proceedings of the 36th International Symposium on Multiple-Valued Logic (ISMVL '06), 2006, 6 pgs.
International Search Report and Written Opinion for PCT/US2014/060745, dated Jan. 21, 2015, 10 pgs.
International Search Report and Written Opinion for PCT/US2014/060879, dated Jan. 21, 2015, 10 pgs.
International Search Report and Written Opinion for PCT/US2014/060892, dated Jan. 27, 2015, 10 pgs.
International Search Report and Written Opinion for PCT/US2014/060886, dated Jan. 26, 2015, 10 pgs.

* cited by examiner

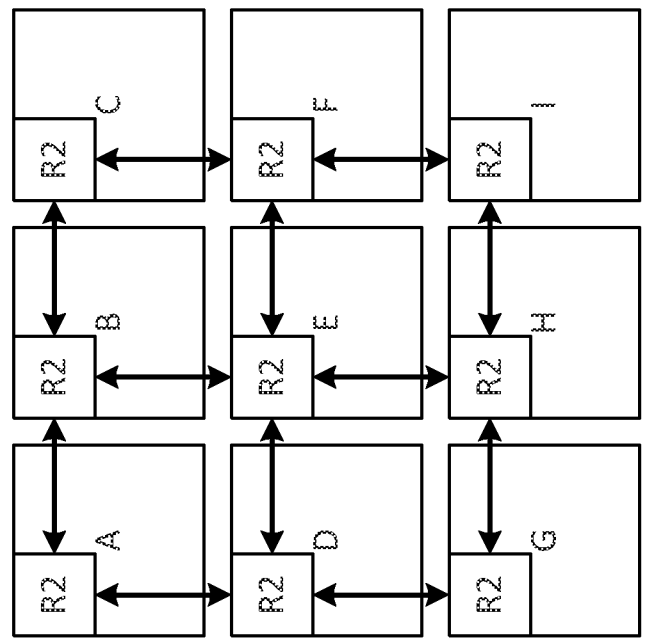
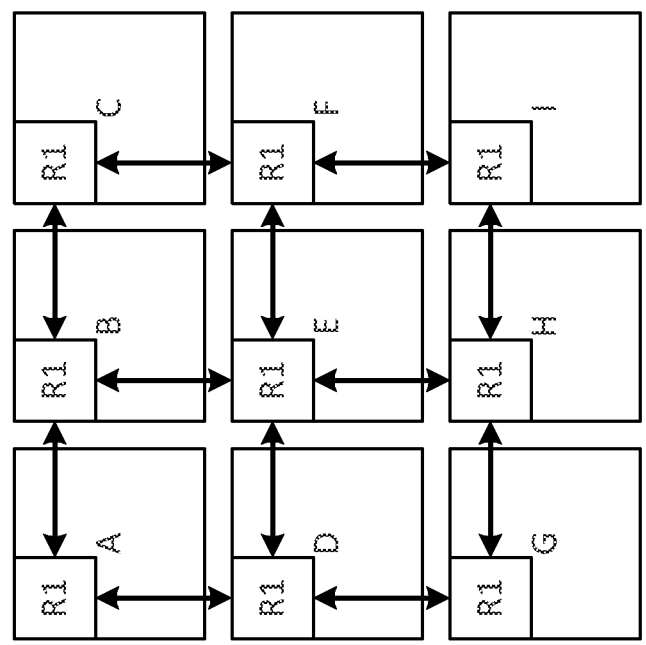
FIG. 3(a)

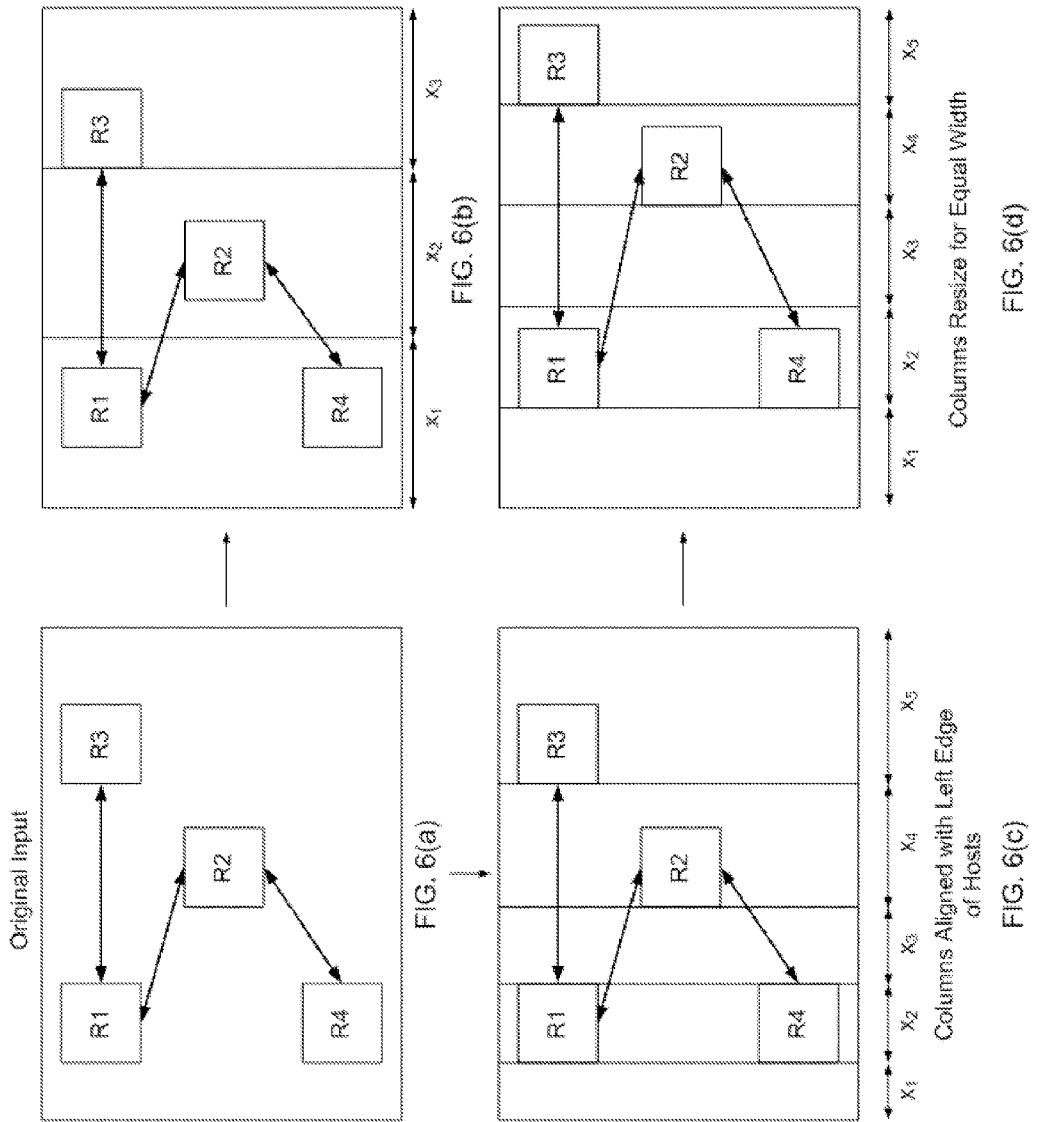

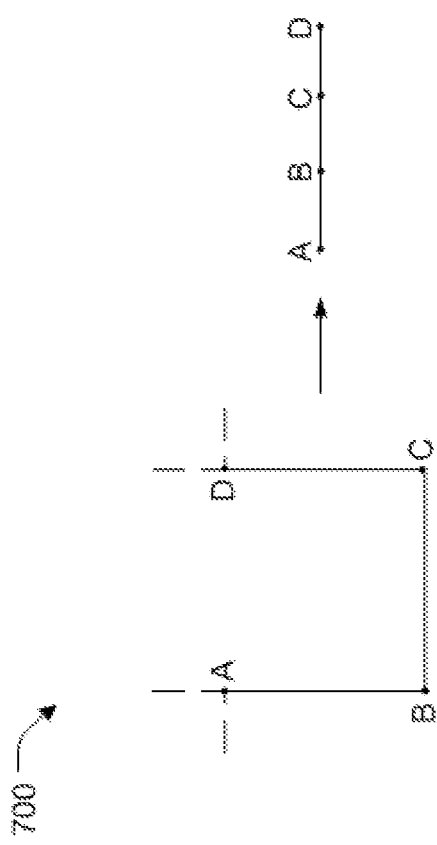
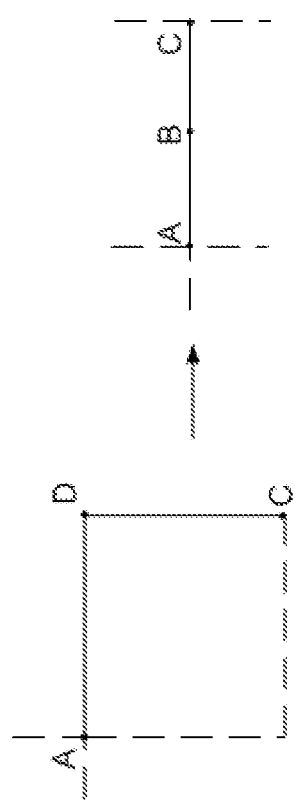
FIG. 7(a)
FIG. 7(b)

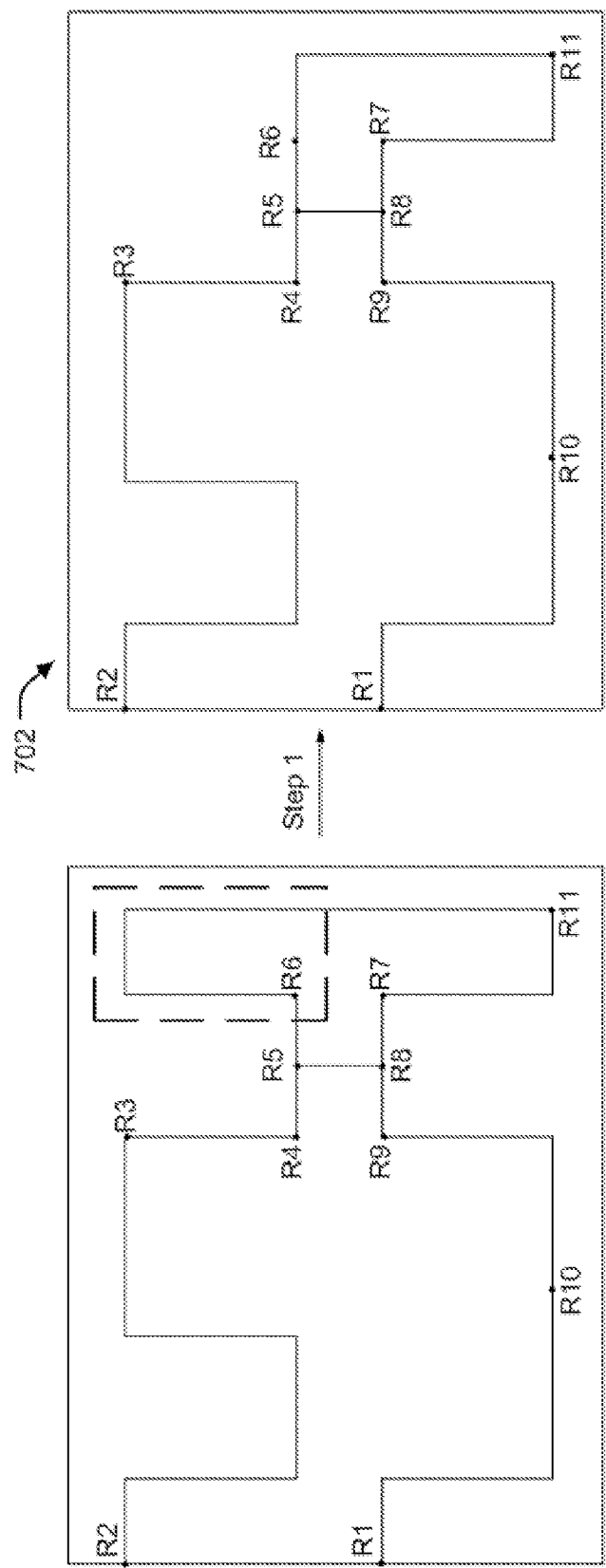

GENERATION OF NETWORK-ON-CHIP LAYOUT BASED ON USER SPECIFIED TOPOLOGICAL CONSTRAINTS

BACKGROUND

Technical Field

Methods and example implementations described herein are generally directed to interconnect architecture, and more specifically, to generation of Network-On-Chip (NoC) layout based on user specified topological constraints.

Related Art

The number of components on a chip is rapidly growing due to increasing levels of integration, system complexity, and shrinking transistor geometry. Complex System-on-Chips (SoCs) may involve a variety of components e.g., processor cores, DSPs, hardware accelerators, memory and I/O, while Chip Multi-Processors (CMPs) may involve a large number of homogenous processor cores, memory and I/O subsystems. In both SoC and CMP systems, the on-chip interconnect plays a role in providing high-performance communication between the various components. Due to scalability limitations of traditional buses and crossbar based interconnects, Network-on-Chip (NoC) has emerged as a paradigm to interconnect a large number of components on the chip. NoC is a global shared communication infrastructure made up of several routing nodes interconnected with each other using point-to-point physical links.

Messages are injected by the source and are routed from the source node to the destination over multiple intermediate nodes and physical links. The destination node then ejects the message and provides the message to the destination. For the remainder of this application, the terms 'components', 'blocks', 'hosts' or 'cores' will be used interchangeably to refer to the various system components which are interconnected using a NoC. Terms 'routers' and 'nodes' will also be used interchangeably. Without loss of generalization, the system with multiple interconnected components will itself be referred to as a 'multi-core system'.

There are several topologies in which the routers can connect to one another to create the system network. Bi-directional rings (as shown in FIG. 1(a)), 2-D (two dimensional) mesh (as shown in FIG. 1(b)) and 2-D Torus (as shown in FIG. 1(c)) are examples of topologies in the related art. Mesh and Torus can also be extended to 2.5-D (two and half dimensional) or 3-D (three dimensional) organizations. FIG. 1(d) shows a 3D mesh NoC, where there are three layers of 3×3 2D mesh NoC shown over each other. The NoC routers have up to two additional ports, one connecting to a router in the higher layer, and another connecting to a router in the lower layer. Router 111 in the middle layer of the example has both ports used, one connecting to the router at the top layer and another connecting to the router at the bottom layer. Routers 110 and 112 are at the bottom and top mesh layers respectively, therefore they have only the upper facing port 113 and the lower facing port 114 respectively connected.

Packets are message transport units for intercommunication between various components. Routing involves identifying a path composed of a set of routers and physical links of the network over which packets are sent from a source to a destination. Components are connected to one or multiple ports of one or multiple routers; with each such port having a unique ID. Packets carry the destination's router and port ID for use by the intermediate routers to route the packet to the destination component.

Examples of routing techniques include deterministic routing, which involves choosing the same path from A to B for every packet. This form of routing is independent from the state of the network and does not load balance across path diversities, which might exist in the underlying network. However, such deterministic routing may implemented in hardware, maintains packet ordering and may be rendered free of network level deadlocks. Shortest path routing may minimize the latency as such routing reduces the number of hops from the source to the destination. For this reason, the shortest path may also be the lowest power path for communication between the two components. Dimension-order routing is a form of deterministic shortest path routing in 2-D, 2.5-D, and 3-D mesh networks. In this routing scheme, messages are routed along each coordinates in a particular sequence until the message reaches the final destination. For example in a 3-D mesh network, one may first route along the X dimension until it reaches a router whose X-coordinate is equal to the X-coordinate of the destination router. Next, the message takes a turn and is routed in along Y dimension and finally takes another turn and moves along the Z dimension until the message reaches the final destination router. Dimension ordered routing may be minimal turn and shortest path routing.

FIG. 2(a) pictorially illustrates an example of XY routing in a two dimensional mesh. More specifically, FIG. 2(a) illustrates XY routing from node '34' to node '00'. In the example of FIG. 2(a), each component is connected to only one port of one router. A packet is first routed over the x-axis till the packet reaches node '04' where the x-coordinate of the node is the same as the x-coordinate of the destination node. The packet is next routed over the y-axis until the packet reaches the destination node.

In heterogeneous mesh topology in which one or more routers or one or more links are absent, dimension order routing may not be feasible between certain source and destination nodes, and alternative paths may have to be taken. The alternative paths may not be shortest or minimum turn.

Source routing and routing using tables are other routing options used in NoC. Adaptive routing can dynamically change the path taken between two points on the network based on the state of the network. This form of routing may be complex to analyze and implement.

A NoC interconnect may contain multiple physical networks. Over each physical network, there may exist multiple virtual networks, wherein different message types are transmitted over different virtual networks. In this case, at each physical link or channel, there are multiple virtual channels; each virtual channel may have dedicated buffers at both end points. In any given clock cycle, only one virtual channel can transmit data on the physical channel.

NoC interconnects may employ wormhole routing, wherein, a large message or packet is broken into small pieces known as flits (also referred to as flow control digits). The first flit is the header flit, which holds information about this packet's route and key message level info along with payload data and sets up the routing behavior for all subsequent flits associated with the message. Optionally, one or more body flits follows the head flit, containing the remaining payload of data. The final flit is the tail flit, which in addition to containing the last payload also performs some bookkeeping to close the connection for the message. In wormhole flow control, virtual channels are often implemented.

The physical channels are time sliced into a number of independent logical channels called virtual channels (VCs).

VCs provide multiple independent paths to route packets, however they are time-multiplexed on the physical channels. A virtual channel holds the state needed to coordinate the handling of the flits of a packet over a channel. At a minimum, this state identifies the output channel of the current node for the next hop of the route and the state of the virtual channel (idle, waiting for resources, or active). The virtual channel may also include pointers to the flits of the packet that are buffered on the current node and the number of flit buffers available on the next node.

The term "wormhole" plays on the way messages are transmitted over the channels: the output port at the next router can be so short that received data can be translated in the head flit before the full message arrives. This allows the router to quickly set up the route upon arrival of the head flit and then opt out from the rest of the conversation. Since a message is transmitted flit by flit, the message may occupy several flit buffers along its path at different routers, creating a worm-like image.

Based upon the traffic between various end points, and the routes and physical networks that are used for various messages, different physical channels of the NoC interconnect may experience different levels of load and congestion. The capacity of various physical channels of a NoC interconnect is determined by the width of the channel (number of physical wires) and the clock frequency at which it is operating. Various channels of the NoC may operate at different clock frequencies, and various channels may have different widths based on the bandwidth requirement at the channel. The bandwidth requirement at a channel is determined by the flows that traverse over the channel and their bandwidth values. Flows traversing over various NoC channels are affected by the routes taken by various flows. In a mesh or Torus NoC, there may exist multiple route paths of equal length or number of hops between any pair of source and destination nodes. For example, in FIG. 2(b), in addition to the standard XY route between nodes 34 and 00, there are additional routes available, such as YX route 203 or a multi-turn route 202 that makes more than one turn from source to destination.

In a NoC with statically allocated routes for various traffic flows, the load at various channels may be controlled by intelligently selecting the routes for various flows. When a large number of traffic flows and substantial path diversity is present, routes can be chosen such that the load on all NoC channels is balanced nearly uniformly, thus avoiding a single point of bottleneck. Once routed, the NoC channel widths can be determined based on the bandwidth demands of flows on the channels. Unfortunately, channel widths cannot be arbitrarily large due to physical hardware design restrictions, such as timing or wiring congestion. There may be a limit on the maximum channel width, thereby putting a limit on the maximum bandwidth of any single NoC channel.

Additionally, wider physical channels may not help in achieving higher bandwidth if messages are short. For example, if a packet is a single flit packet with a 64-bit width, no matter how wide a channel is, the channel will only be able to carry 64 bits per cycle of data if all packets over the channel are similar. Thus, a channel width is also limited by the message size in the NoC. Due to these limitations on the maximum NoC channel width, a channel may not have enough bandwidth in spite of balancing the routes.

To address the above bandwidth concern, multiple parallel physical NoCs may be used. Each NoC may be called a layer, thus creating a multi-layer NoC architecture. Hosts inject a message on a NoC layer which is then routed to the destination on the same NoC layer, where it is delivered from the NoC layer to the host. Thus, each layer operates more or less independently from each other, and interactions between layers may only occur during the injection and ejection times. FIG. 3(a) illustrates a two layer NoC. Here the two NoC layers are shown adjacent to each other on the left and right, with the hosts connected to the NoC replicated in both left and right diagrams. A host is connected to two routers of different layers, wherein, for instance a router connected to host in the first layer is shown as R1, and a router connected to the same host in the second layer is shown as R2. In this example, the multi-layer NoC is different from the 3D NoC. In this case multiple layers are on a single silicon die and are used to meet the high bandwidth demands of the communication between hosts on the same silicon die. Messages do not go from one layer to another. For purposes of clarity, the present application will utilize such a horizontal left and right illustration for multi-layer NoC to differentiate from the 3D NoCs, which are illustrated by drawing the NoCs vertically over each other.

In FIG. 3(b), a host connected to a router from each layer, R1 and R2 respectively, is illustrated. Each router is connected to other routers in its layer using directional ports 301, and is connected to the host using injection and ejection ports 302. A bridge-logic 303 may sit between the host and the two NoC layers to determine the NoC layer for an outgoing message and sends the message from host to the NoC layer, and also perform the arbitration and multiplexing between incoming messages from the two NoC layers and delivers them to the host.

In a multi-layer NoC, the number of layers needed may depend upon a number of factors such as the aggregate bandwidth requirement of all traffic flows in the system, the routes that are used by various flows, message size distribution, maximum channel width, etc. Once the number of NoC layers in NoC interconnect is determined in a design, different messages and traffic flows may be routed over different NoC layers. Additionally, one may design NoC interconnects such that different layers have different topologies in number of routers, channels and connectivity. The channels in different layers may have different widths based on the flows that traverse over the channel and their bandwidth requirements. With such a large variety of design choices, determining the right combination of routers, channels, and interconnections for a given system remains a challenge and time consuming manual process, often resulting in sub-optimal and inefficient designs.

System on Chips (SoCs) are becoming increasingly sophisticated, feature rich, and high performance by integrating a growing number of standard processor cores, memory & I/O subsystems, and specialized acceleration IPs. To address this complexity, the Network-on-Chip (NoC) approach of connecting SoC components is gaining popularity. A NoC can provide connectivity to a plethora of components and interfaces and simultaneously enable rapid design closure by being automatically generated from a high level specification. The specification describes the interconnect requirements of the SoC in terms of connectivity, bandwidth and latency. In addition to this, information such as position of various components, protocol information, clocking and power domains, etc. may be supplied. A NoC compiler can then use this specification to automatically design a NoC for the SoC. A number of NoC compilers were introduced in the related art that automatically synthesize a NoC to fit a traffic specification. In such design flows, the synthesized NoC is simulated to evaluate the performance under various operating conditions and to determine whether the specifications are met. This may be necessary because NoC-style interconnects are distributed systems and their dynamic performance characteristics under load are difficult to predict statically and can be very sensitive to a wide variety of parameters.

In order to obtain an efficient and resource-sensitive NoC architecture, it is therefore important and desired to generate an optimal NoC layout based on user specified topological constraints.

SUMMARY

The present disclosure is directed to an architecture that enables generation of an optimal NoC layout based on user specified topological constraints. In an aspect, the NoC layout is defined such that the number of turns, while routing between two or more NoC elements such as routers and bridges, is minimal across the complete system.

In an aspect, the present disclosure provides a method that comprises automatic generation of a NoC from specified topological information based on projecting NoC elements of the NoC onto a grid layout. In an instance, although the present disclosure is being explained with reference to the NoC elements being routers and/or bridges, any other appropriate NoC element is completely within the scope of the present disclosure. In an aspect, the specified topological information, including specification of putting constraints on positions/locations of NoC elements and links thereof, can be input by a user in real space, and can then be projected on the grid layout.

According to one embodiment, automatic generation of the NoC from the specified topological information can include projecting a plurality of nodes, a plurality of routers, and a plurality of links onto the grid layout based on the specified topological information, wherein the projected plurality of routers, the plurality of nodes, and the plurality of links can initially be disabled, and then selectively enabled for at least one of the plurality of routers, the plurality of nodes, and the plurality of links on the grid layout based on one or more constraints for one or more layers of the NoC. In another aspect, NoC agents can be provided on the enabled plurality of nodes of the grid layout. In another aspect, traffic can be provided between the enabled NoC agents, and mapping can be performed for the traffic to the enabled routers and the enabled links of the NoC.

According to one embodiment, automatic generation of the NoC from the specified topological information can include projecting a plurality of routers, a plurality of nodes, and a plurality of links onto the grid layout based on the specified topological information, wherein the projected plurality of routers, the plurality of nodes, and the plurality of links can be initially enabled, and then selectively disabled for at least one of the plurality of routers, the plurality of nodes, and the plurality of links on the grid layout based on one or more constraints for one or more layers of the NoC. In another aspect, NoC agents can be provided on the enabled plurality of nodes of the grid layout. In another aspect, traffic can be provided between the enabled NoC agents, and mapping can be performed for the traffic to the enabled routers and the enabled links of the NoC.

According to one embodiment, automatic generation of the NoC from the specified topological information can include projecting a plurality of routers, a plurality of links, and a plurality of NoC agents onto a heterogeneous grid layout based on one or more constraints for one or more layers of the NoC and the specified topological information, wherein grid sizes of the heterogeneous grid layout can be derived from the specified topological information. In an aspect, once configured on the grid layout, traffic can be provided between the plurality of NoC agents to enable mapping of the traffic to the NoC.

According to one embodiment, automatic generation of the NoC from the specified topological information can include projecting onto an auto-determined grid, a plurality of routers, a plurality of links, and a plurality of NoC agents based on the specified topological information, such that once projected, traffic can be provided between the plurality of NoC agents and traffic to the NoC can be mapped.

According to one embodiment, automatic generation of the NoC from the specified topological information can include projecting a plurality of agents, a plurality of routers, and a plurality of links onto a grid layout from the specified topological information, and transforming the plurality of links, the plurality of routers, and the plurality of agents on the grid layout to another grid layout through a space transformation algorithm, wherein the space transformation algorithm can be configured to address one or more constraints of one or more layers of the NoC. In another aspect, traffic can be provided between the transformed plurality of agents, and the traffic provided to the NoC can be mapped.

In an example embodiment, disclosure of the present disclosure relates to a non-transitory computer readable medium, storing instructions for executing a process, the instructions comprising automatic generation of NoC from specified topological information based on projecting NoC elements to a grid layout.

The foregoing and other objects, features and advantages of the example implementations will be apparent and the following more particular descriptions of example implementations as illustrated in the accompanying drawings wherein like reference numbers generally represent like parts.

BRIEF DESCRIPTION OF THE DRAWINGS

FIG. 3(a) illustrates an example of a related art two layer NoC interconnect.

FIGS. 6(a) to 6(d) illustrate example representations showing automatic generation of NoC from specified topological information/constraints.

FIGS. 7(a) to 7(i) illustrate example representations showing automatic generation of NoC from specified topological information/constraints.

DETAILED DESCRIPTION

Figure 1A:
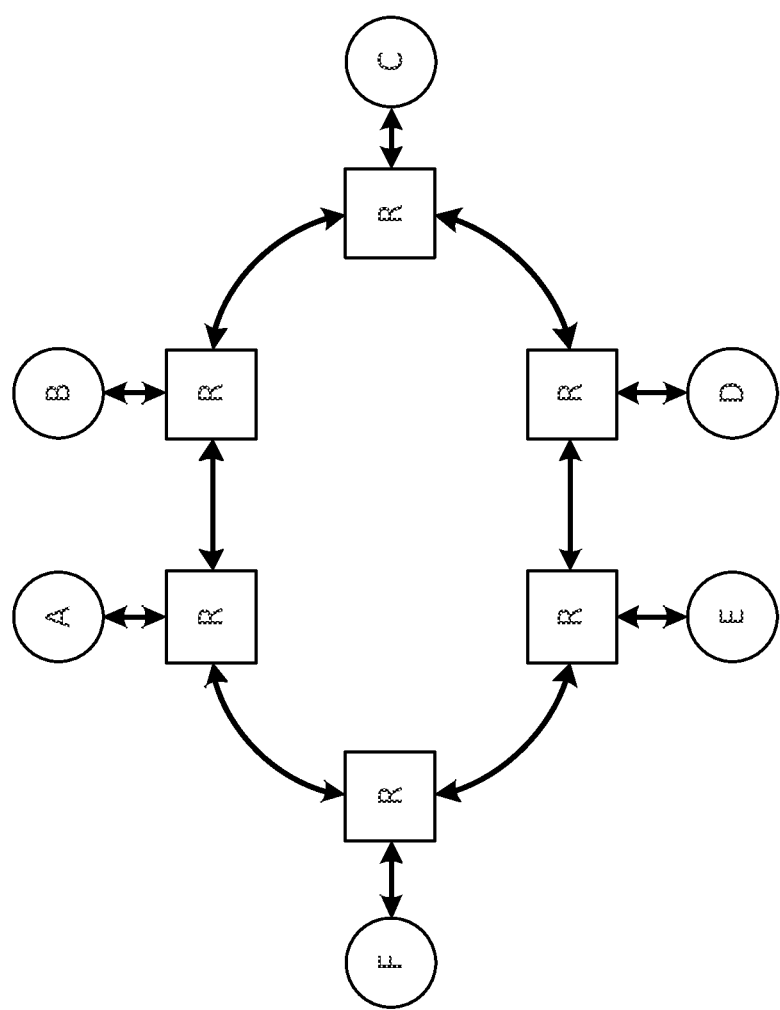
FIGS. 1(a), 1(b) 1(c) and 1(d) illustrate examples of Bidirectional ring, 2D Mesh, 2D Torus, and 3D Mesh NoC Topologies.
Figure 1B:
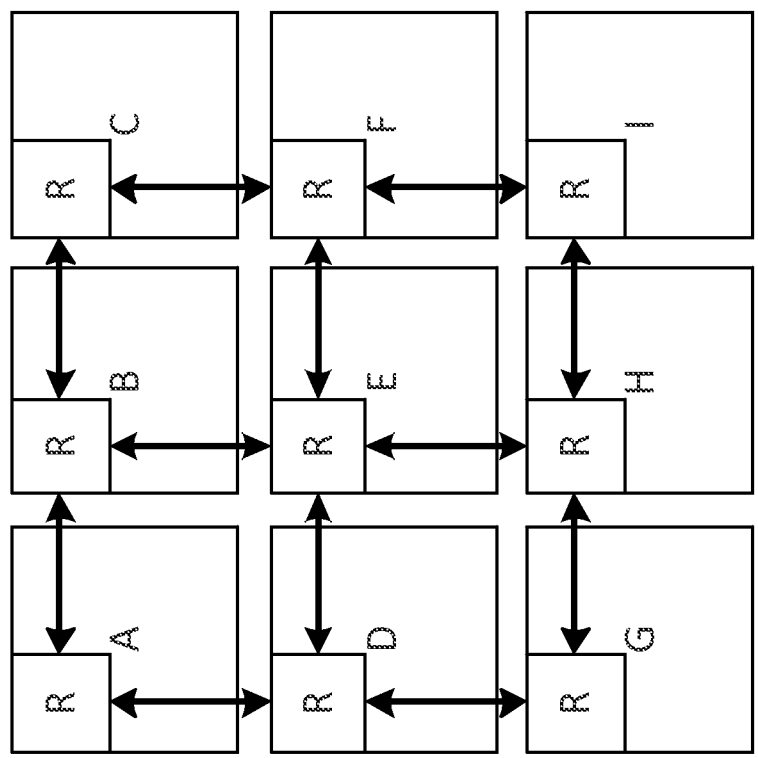
Figure 1C:
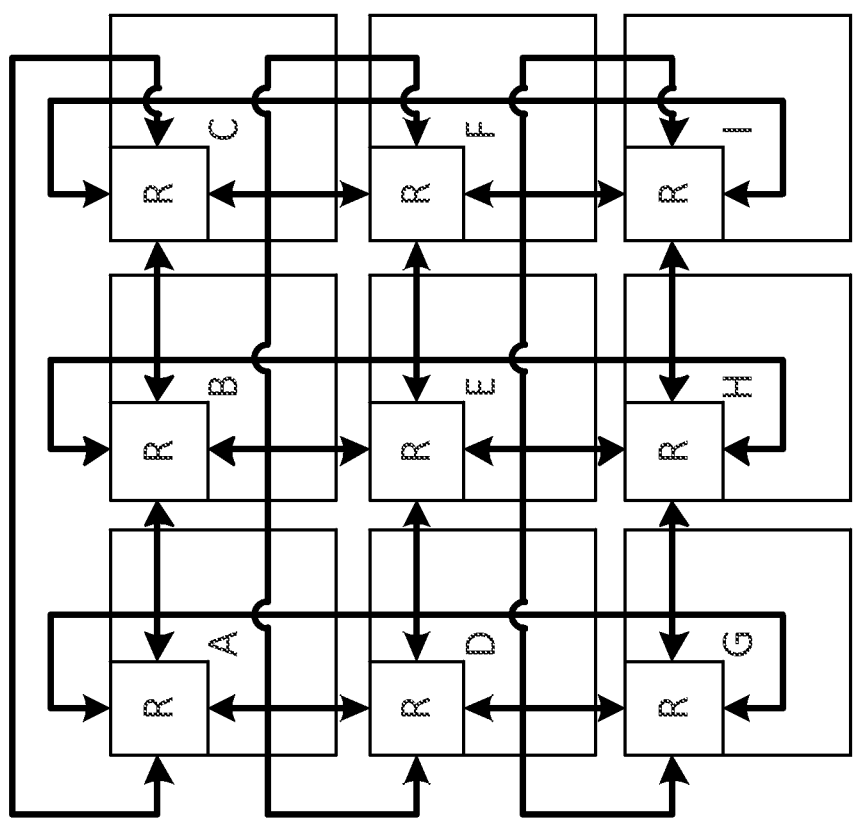
Figure 1D:
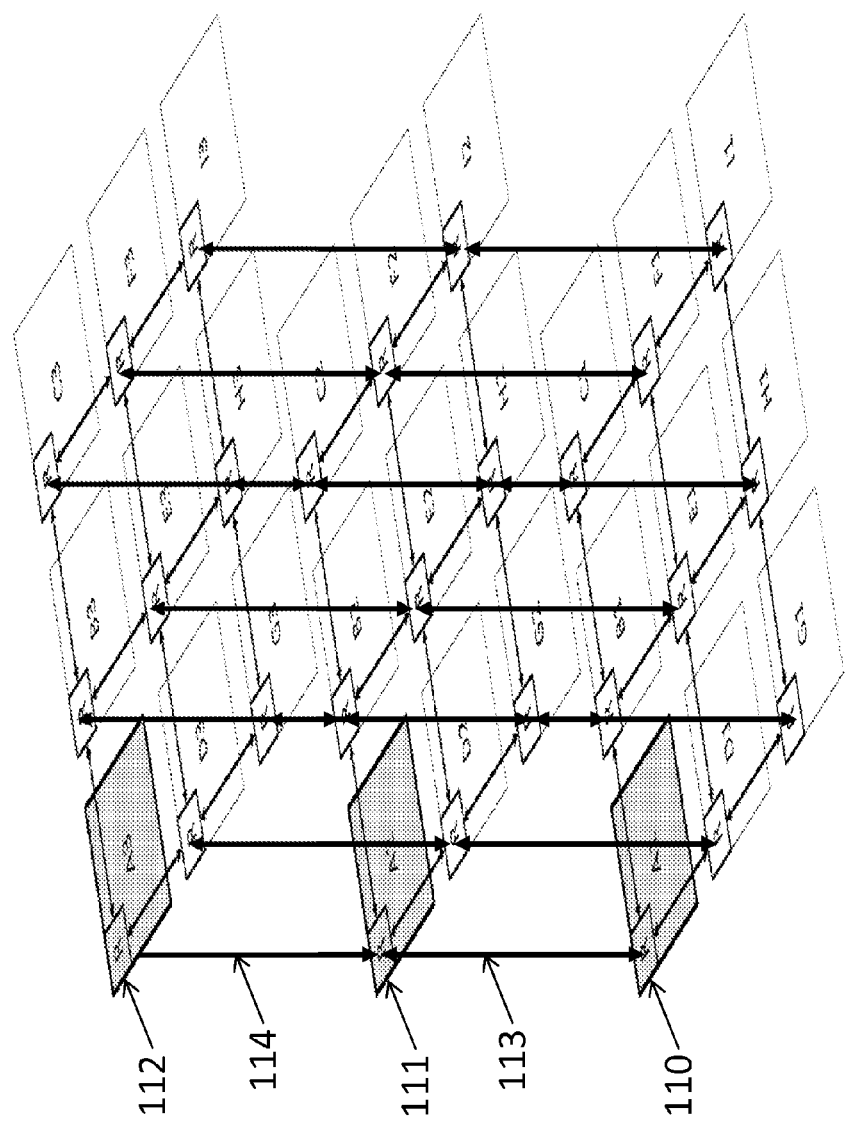
Figure 2A:
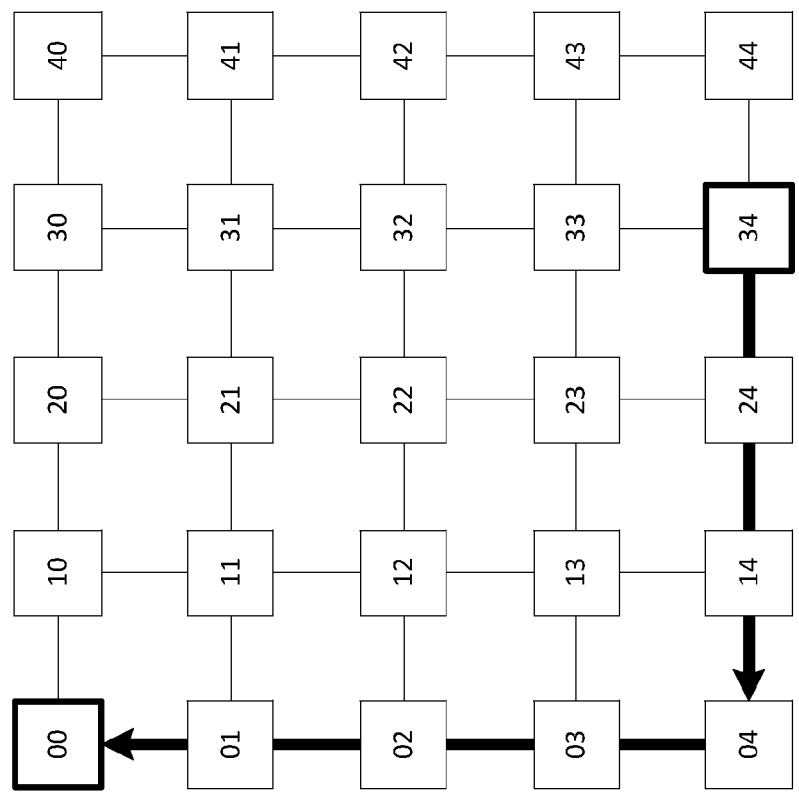
FIG. 2(a) illustrates an example of XY routing in a related art two dimensional mesh.
Figure 2B:
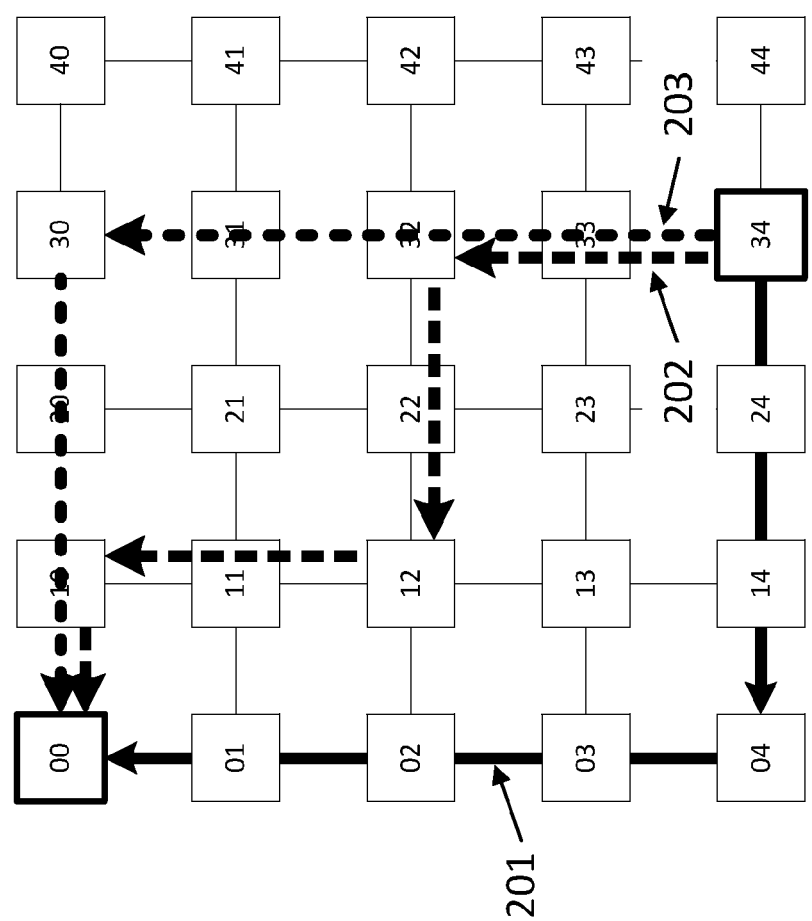
FIG. 2(b) illustrates three different routes between a source and destination nodes.
Figure 3B:
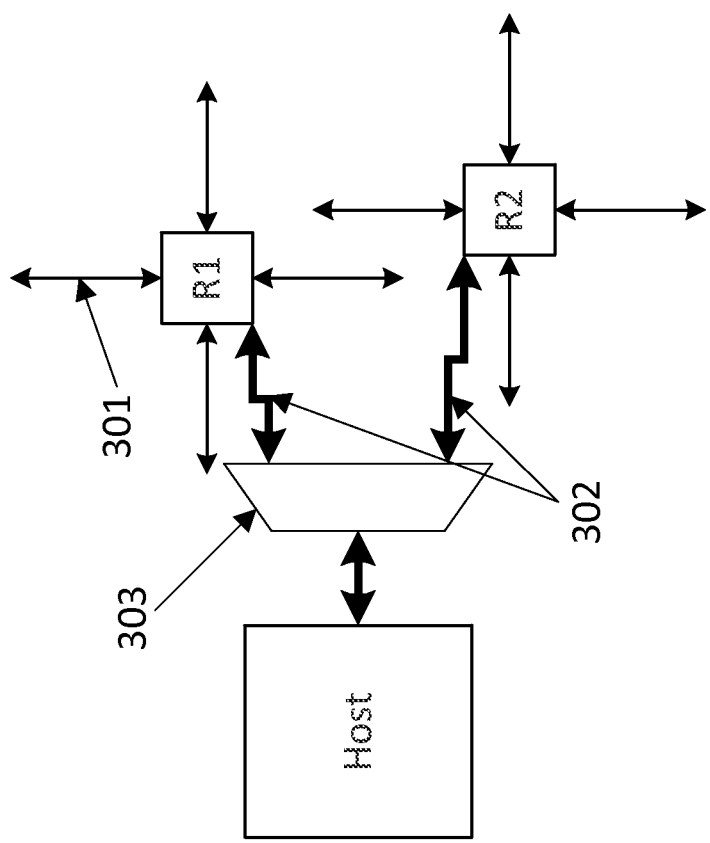
FIG. 3(b) illustrates the related art bridge logic between host and multiple NoC layers.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Aspects of the present disclosure are directed to methods, systems, and non-transitory computer readable mediums for providing an architecture that enables generation of an optimal NoC layout based on user specified topological constraints. In an aspect, the NoC layout is defined such that the number of turns, while routing between two or more NoC elements such as routers and bridges, is minimal across the complete system.

In an aspect, the present disclosure provides a method that comprises automatic generation of a NoC from specified topological information based on projecting NoC elements of the NoC onto a grid layout. In an instance, although the present disclosure is being explained with reference to the NoC elements being routers and/or bridges, any other appropriate NoC element is completely within the scope of the present disclosure. In an aspect, the specified topological information, including specification of putting constraints on positions/locations of NoC elements and links thereof, can be input by a user in real space, and can then be projected on the grid layout.

According to one embodiment, automatic generation of the NoC from the specified topological information can include projecting a plurality of nodes, a plurality of routers, and a plurality of links onto the grid layout based on the specified topological information, wherein the projected plurality of routers, the plurality of nodes, and the plurality of links can initially be disabled, and then selectively enabled for at least one of the plurality of routers, the plurality of nodes, and the plurality of links on the grid layout based on one or more constraints for one or more layers of the NoC. In another aspect, NoC agents can be provided on the enabled plurality of nodes of the grid layout. In another aspect, traffic can be provided between the enabled NoC agents, and mapping can be performed for the traffic to the enabled routers and the enabled links of the NoC.

According to one embodiment, automatic generation of the NoC from the specified topological information can include projecting a plurality of routers, a plurality of nodes, and a plurality of links onto the grid layout based on the specified topological information, wherein the projected plurality of routers, the plurality of nodes, and the plurality of links can be initially enabled, and then selectively disabled for at least one of the plurality of routers, the plurality of nodes, and the plurality of links on the grid layout based on one or more constraints for one or more layers of the NoC. In another aspect, NoC agents can be provided on the enabled plurality of nodes of the grid layout. In another aspect, traffic can be provided between the enabled NoC agents, and mapping can be performed for the traffic to the enabled routers and the enabled links of the NoC.

According to one embodiment, automatic generation of the NoC from the specified topological information can include projecting a plurality of routers, a plurality of links, and a plurality of NoC agents onto a heterogeneous grid layout based on one or more constraints for one or more layers of the NoC and the specified topological information, wherein grid sizes of the heterogeneous grid layout can be derived from the specified topological information. In an aspect, once configured on the grid layout, traffic can be provided between the plurality of NoC agents to enable mapping of the traffic to the NoC.

According to one embodiment, automatic generation of the NoC from the specified topological information can include projecting onto an auto-determined grid, a plurality of routers, a plurality of links, and a plurality of NoC agents based on the specified topological information, such that once projected, traffic can be provided between the plurality of NoC agents and traffic to the NoC can be mapped.

According to one embodiment, automatic generation of the NoC from the specified topological information can include projecting a plurality of agents, a plurality of routers, and a plurality of links onto a grid layout from the specified topological information, and transforming the plurality of links, the plurality of routers, and the plurality of agents on the grid layout to another grid layout through a space transformation algorithm, wherein the space transformation algorithm can be configured to address one or more constraints of one or more layers of the NoC. In another aspect, traffic can be provided between the transformed plurality of agents, and the traffic provided to the NoC can be mapped.

According to one embodiment, aspects of the present disclosure relate to creation of a constraint grid after applying user specified topological constraints, wherein the topological constraints can be specified by a user, for instance in the real space, by giving a list of bridges and/or routers and/or NoC elements and/or links along with, say their placement/location on a SoC, along with mentioning other constraints desired by the user. Such specified topological constraints can be processed into a grid, which is representative of the NoC layout.

According to one embodiment, using the space transformation algorithm, a virtual NoC layout can be created to enable a simple NoC architecture by incorporating minimal number of turns/resources, and can lead to potential change in the complete virtual grid layout.

According to another example embodiment, NoC layout of the present disclosure can be automatically generated from specified topological constraints based on processing of one or more NoC elements on a standardized grid for layout by projecting the NoC elements onto the grid map. According to one embodiment, the grid layout can be mesh of any size, such as a 6*6 mesh, or any other size for that matter. According to another embodiment, NoC elements can be projected on the grid so as to enable bidirectional reduction.

In an example embodiment, disclosure of the present disclosure relates to automatic generation of NoC from specified topological information based on projecting NoC elements to a grid layout.

Figure 4:
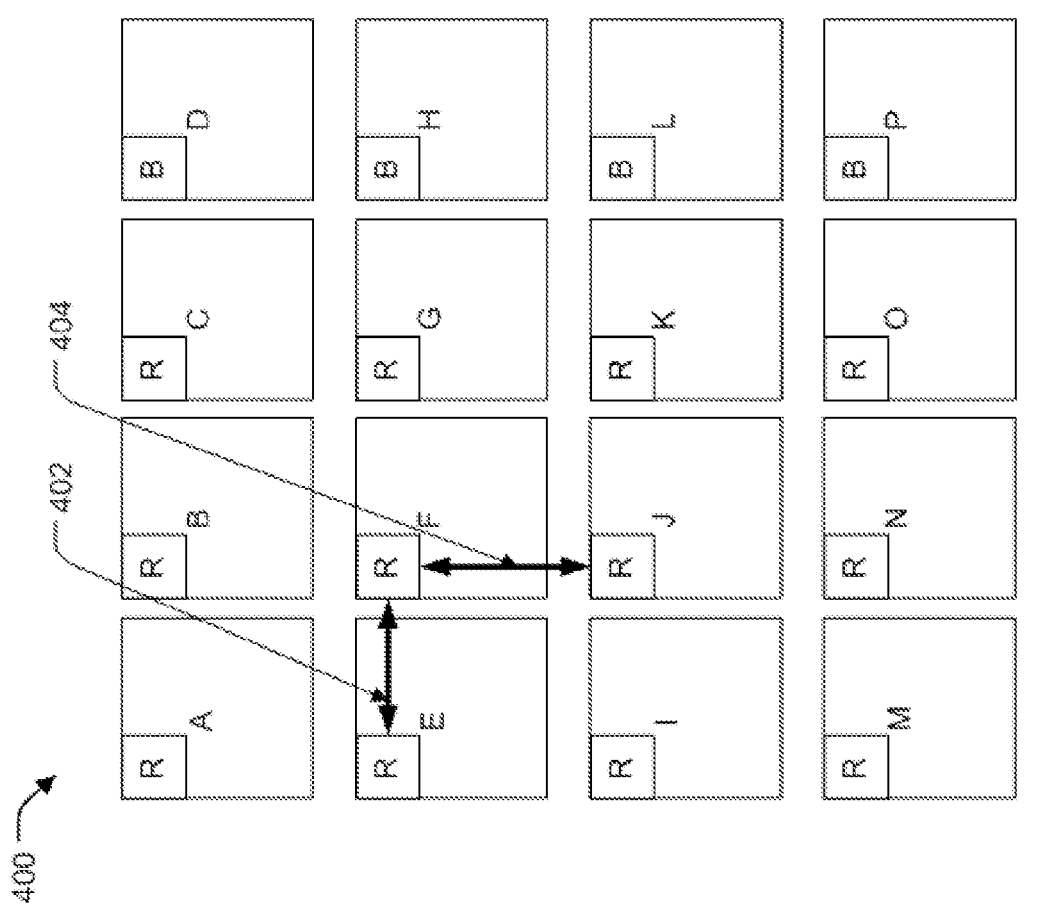
FIG. 4 illustrates an example representation showing automatic generation of NoC from specified topological information/constraints.

FIG. 4 illustrates an example representation 400 showing automatic generation of NoC from specified topological information/constraints based on projecting NoC elements onto a grid layout by projecting a plurality of nodes, a plurality of routers, and a plurality of links onto the grid layout based on the specified topological information, wherein the projected plurality of routers, the plurality of nodes, and the plurality of links are initially disabled, and then selectively enabled for at least one of the plurality of routers, the plurality of nodes, and the plurality of links on the grid layout based on one or more constraints for one or more layers of the NoC. Grid 400 represents a plurality of routers and bridges that are configured on the grid initially, and then link there between are then selectively enabled between specific routers and/or bridges by activation of their links. For instance, although multiple routers and bridges have been configured, links for only links 402 and 404 have been activated. Once enabled, NoC agents can be provided on the enabled ones of the plurality of nodes of the grid layout and traffic can be provided between the provided NoC agents. In another aspect, traffic to the enabled ones of the plurality of routers and the plurality of links of the NoC can also be mapped.

Figure 5:
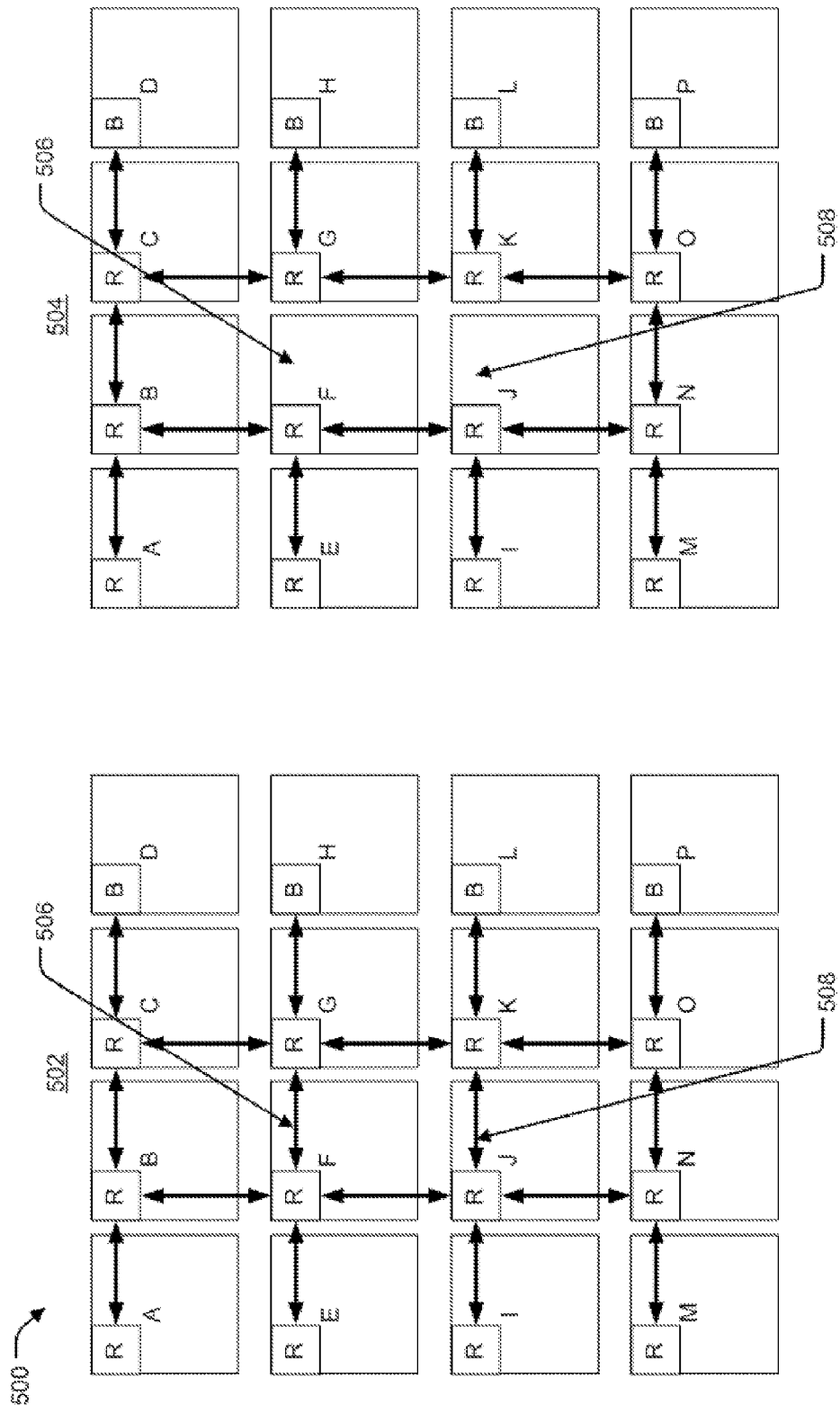
FIG. 5 illustrates another example representation showing automatic generation of NoC from specified topological information/constraints.
Figure 7C:
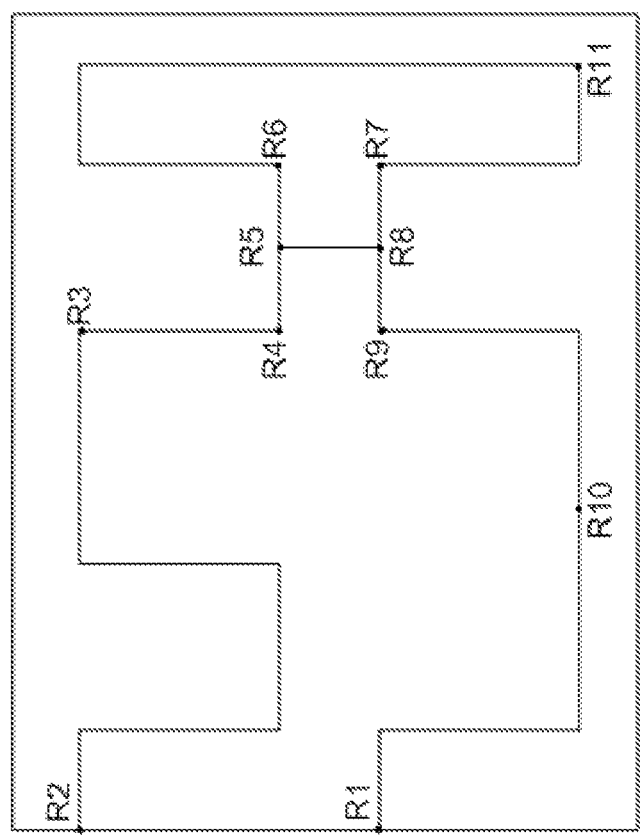
Figure 7E:
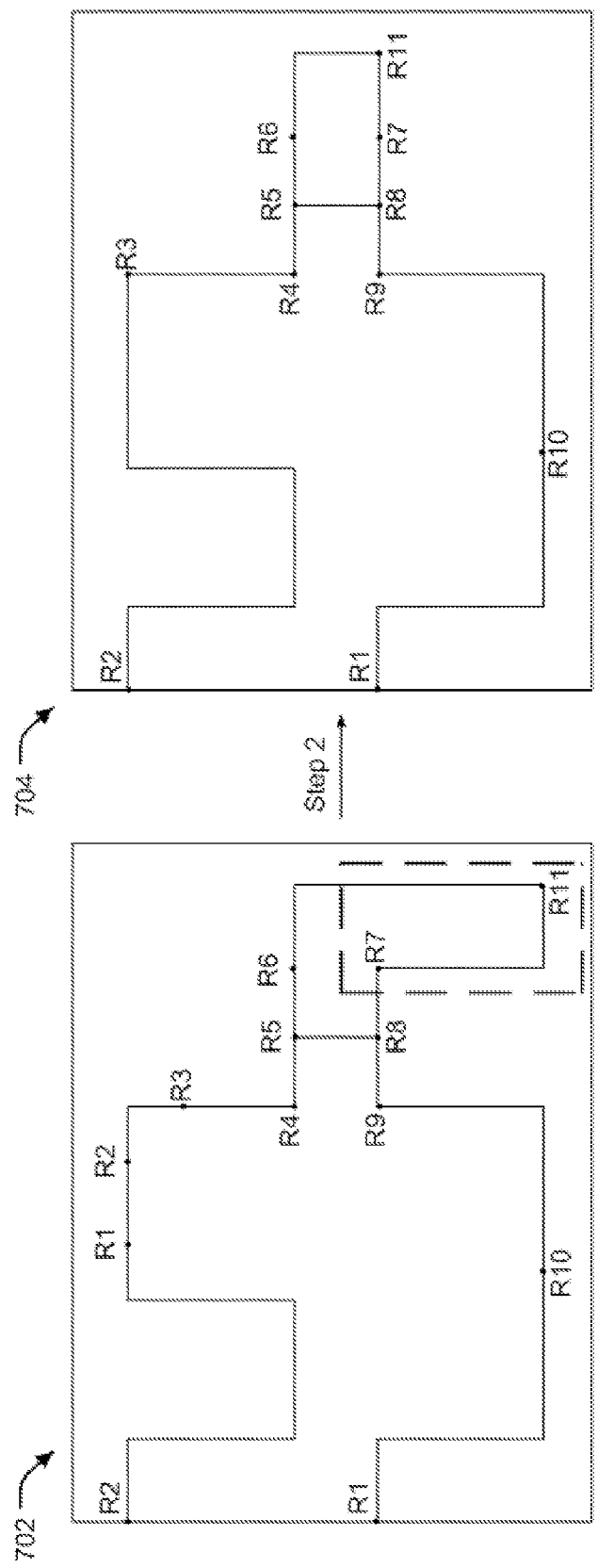
Figure 7F:
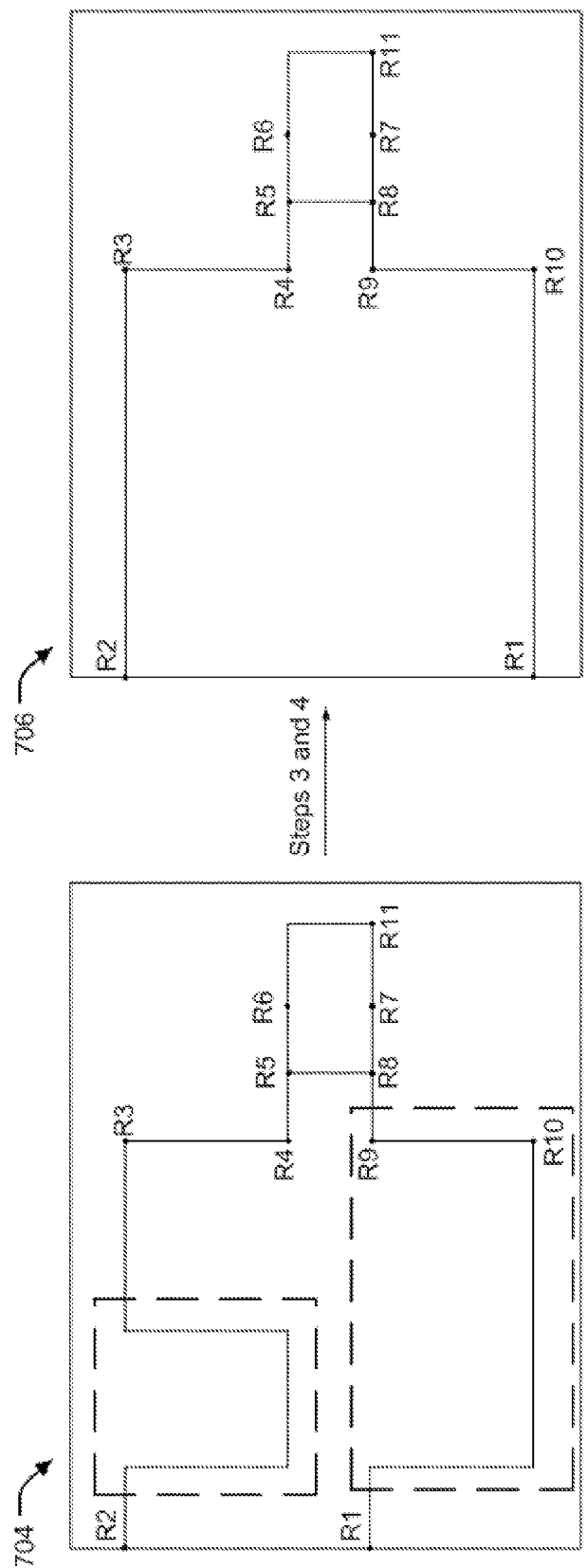
Figure 7G:
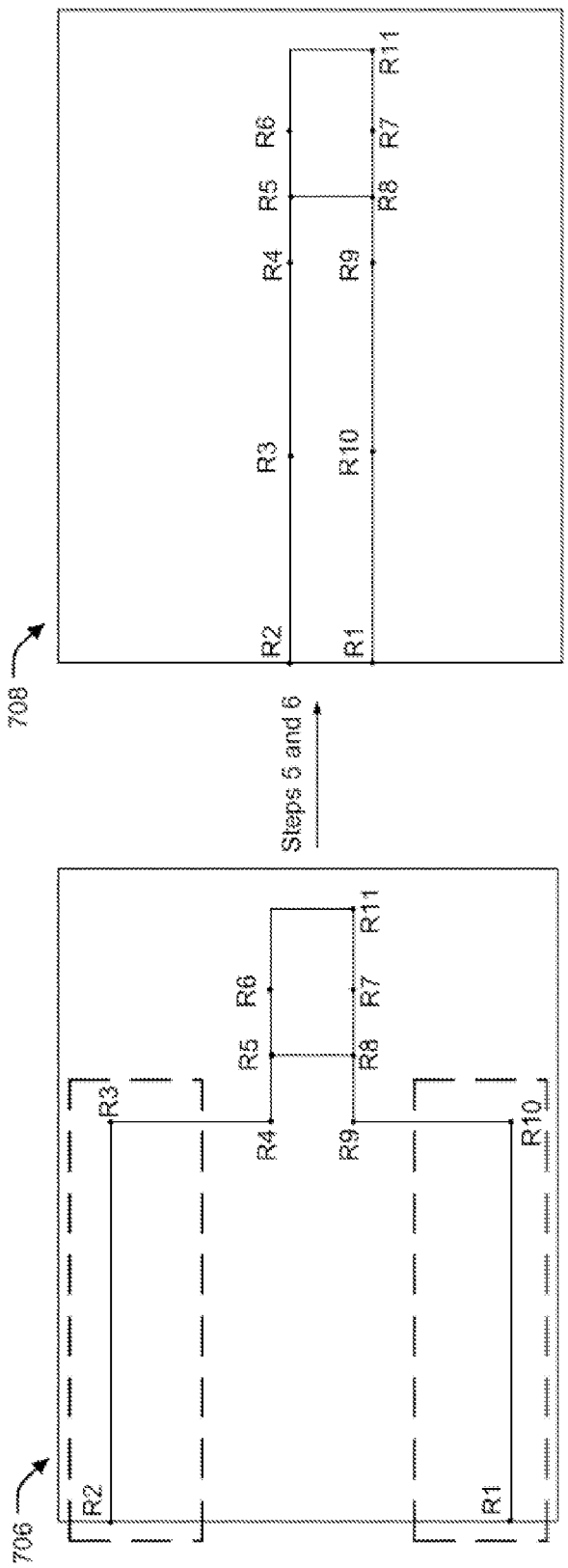
Figure 7H:
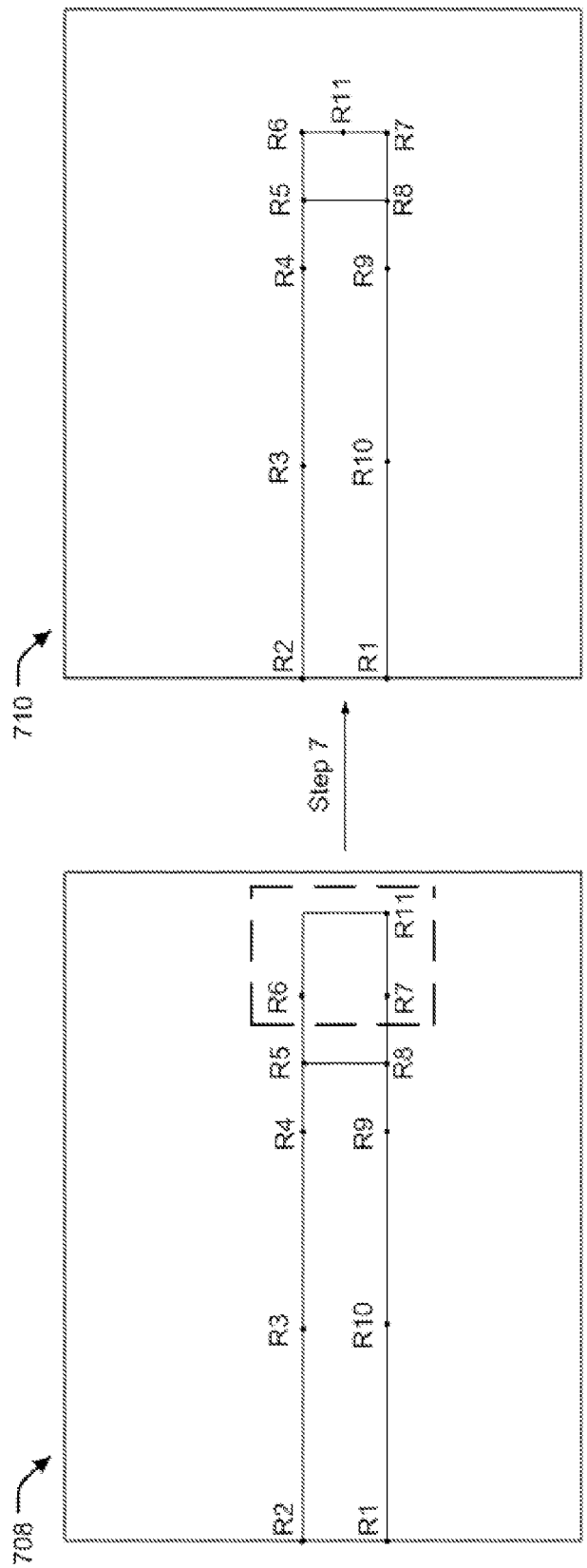
Figure 7I:
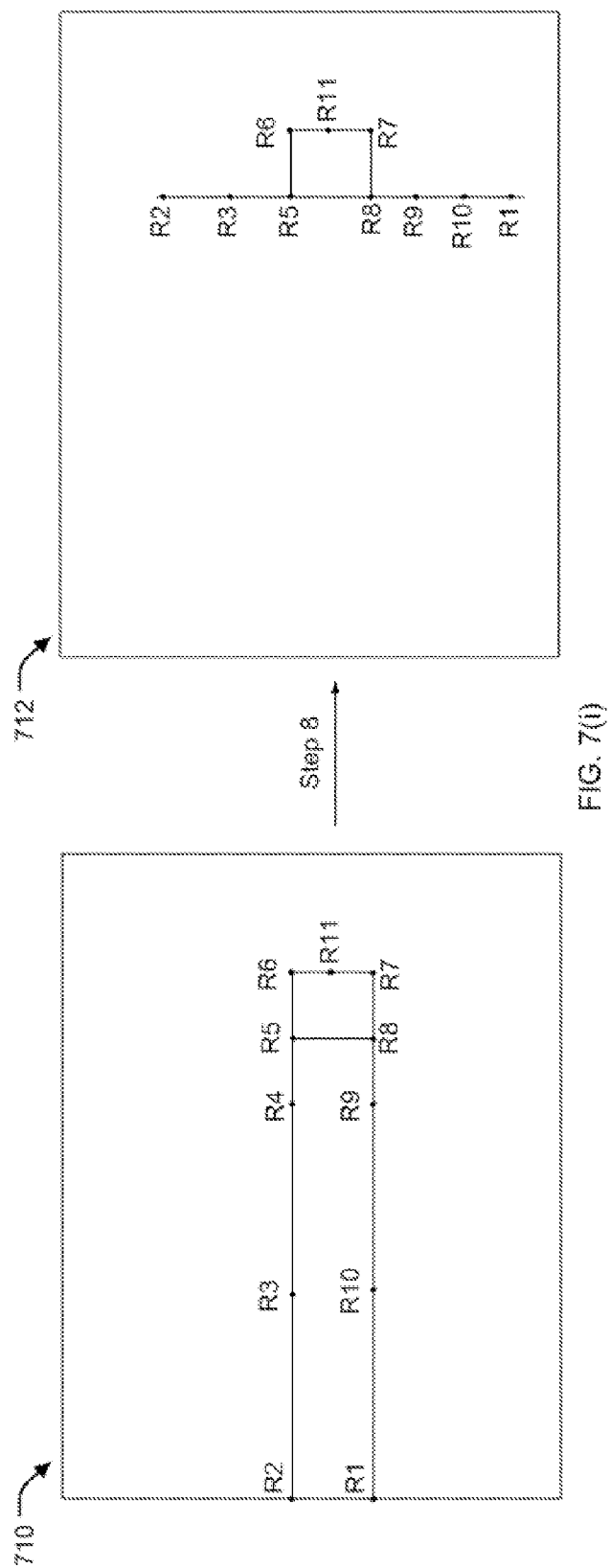

FIG. 5 illustrates an example representation 500 showing automatic generation of NoC from specified topological information/constraints based on projecting NoC elements onto a grid layout by projecting a plurality of nodes, a plurality of routers, and a plurality of links onto the grid layout based on the specified topological information, wherein the projected plurality of routers, the plurality of nodes, and the plurality of links are initially enabled, and then selectively disabled for at least one of the plurality of routers, the plurality of nodes, and the plurality of links on the grid layout based on one or more constraints for one or more layers of the NoC. Grid 502 represents a plurality of routers and bridges that are initially configured on the grid with their links enabled, wherein the links there between can then be selectively disabled between specific routers and/or bridges by deactivation of their links, as is shown in representation 504. For instance, although multiple routers and bridges have been configured, links such as 506 and 508 have been de-activated. Once disabled, NoC agents can be provided on the enabled ones of the plurality of nodes of the grid layout and traffic can be provided between the provided NoC agents. In another aspect, traffic to the enabled ones of the plurality of routers and the plurality of links of the NoC can also be mapped.

FIGS. 6(*a*) to 6(*d*) illustrates example representations showing automatic generation of NoC from specified topological information/constraints based on projecting NoC elements onto one or more grid layouts by projecting a plurality of routers, a plurality of links, and a plurality of NoC agents onto a grid layout based on one or more constraints for one or more layers of the NoC and the specified topological information, wherein grid sizes of the heterogeneous grid layout are derived from the specified topological information. As shown, original input layout of NoC agents shown in FIG. 6(*a*) can be directly transitioned to an equal column width layout as shown in FIG. 6(*b*), wherein spacing along the X-axis (depicting grid sizes) is same and represents a homogeneous grid layout where the routers and/or the bridges are configured based on their configuration in terms of space, distance, position, and construction in the real space. Once arranged on the homogeneous grid layout, traffic can be provided between the plurality of NoC agents and the traffic can be mapped to the NoC.

FIG. 6(*c*) shows another grid representation from the original input of FIG. 6(*a*), wherein the representation of FIG. 6(*c*) shows a heterogeneous grid layout having different width sizes based on alignment, topological information/ constraints, position, location, among other parameters of the NoC agent. As further shown, heterogeneous grid layout of FIG. 6(*c*) can, in an aspect, further be automatically converted into a grid layout by projecting an auto-determined grid on a plurality of routers, a plurality of links, and a plurality of NoC agents based on the specified topological information, and providing traffic between the plurality of NoC agents and mapping the traffic to the NoC. As can be seen, representation of FIG. 6(*d*) comprises projection of router/bridge attributes such as location, construction, links, position, space, onto the auto-determined grid that has equal spacing and sizing as regards the X-axis. The present embodiment therefore enables determination of the grid based on business specification based on real coordinate and not the grid coordinates, wherein based on different types of specifications, the proposed system automatically transitions the real space to a constrained grid.

FIGS. 7(*a*) through 7(*i*) illustrate example representations showing automatic generation of NoC from specified topological information/constraints based on projecting NoC elements onto a grid layout by providing a plurality of agents, a plurality of routers, and a plurality of links onto a grid layout from the specified topological information, and transforming the plurality of links, the plurality of routers, and the plurality of agents on the grid layout to another grid layout through a space transformation algorithm, wherein the space transformation algorithm can be configured to address one or more constraints of one or more layers of the NoC. The illustrated representations illustrate taking an arbitrary topology that has been drawn by a user and flattening the topology and constraints defined therein into a virtual topology, say wherein there is no need to take any turns. In an aspect, traffic can then be provided between the transformed plurality of agents and the provided traffic can be mapped to the NoC. FIGS. 7(*a*) and 7(*b*) two exemplary rules/topologies that can be incorporated while changing/ flattening the grid layout, wherein FIG. 7(*a*) illustrates a U type removal that converts NoC agents configured in U-shape to a flat architecture, and FIG. 7(*b*) illustrates a L type removal that converts NoC agents configured in L-shape to a flat architecture.

FIG. 7(*c*) illustrates an original input layout having say 11 routers/NoC agents from R1-R11. FIG. 7(*d*) illustrates a U-type compression on the original input layout of FIG. 7(*c*) to give representation 702. FIG. 7(*e*) takes the representation of 702 to implement another U-type compression and yield 704. FIG. 7(*f*) takes the representation 704 to implement two more U-type compressions to yield 706, wherein FIG. 7(*g*) takes the representation 706 to implement two L-type compressions to yield 708. FIG. 7(*h*) takes the representation 708 to implement another U-type compression to yield 710. FIG. 7(*i*) takes the representation 710 to implement another U-type compression to yield 712.

Figure 8:
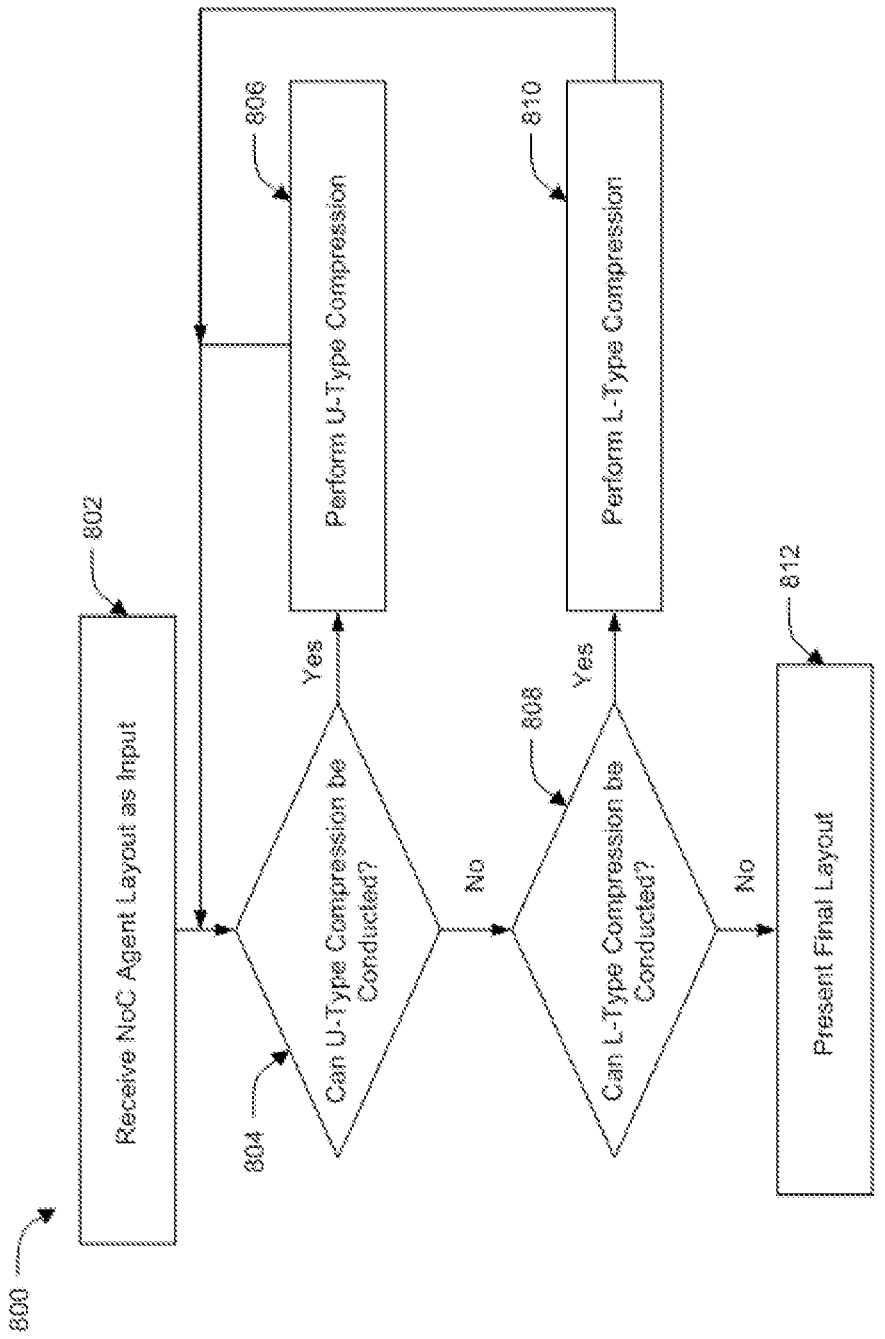
FIG. 8 illustrates another example representation showing automatic generation of NoC from specified topological information/constraints.

FIG. 8 illustrates an example flow diagram 800 in an aspect of the present disclosure. In step 802, an original NoC agent layout can be received and at step 804, it can be checked if a U-type compression can be applied on the layout with an attempt to flatten the grid layout, wherein in case the U-type compression can be applied, the same can be performed at 806 and the method can go back to step 804. In case U-type compression cannot be applied, at step 808, it can be checked as to whether L-type compression can be applied, wherein in case the L-type compression can be applied, the same can be performed at 810 and the method can go back to step 804. In case L-type compression cannot be applied, the final layout can be presented as the final output at step 812.

One should appreciate that the compression mechanisms disclosed herein are completely exemplary in nature and any other technique can be used to create the flattened virtual grid, all of which are completely within the scope of the present disclosure.

Figure 9:
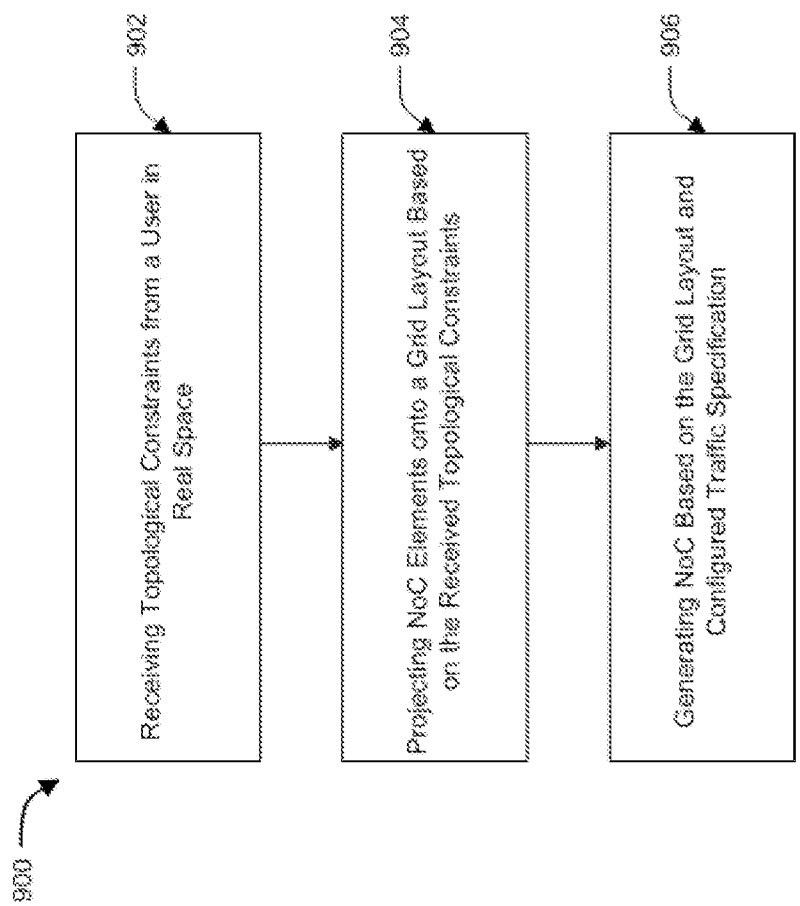
FIG. 9 illustrates an example flow diagram showing automatic generation of NoC from specified topological information/constraints.

FIG. 9 illustrates an example flow diagram 900 in an aspect of the present disclosure. In step 902, topological constraints specified by a user can be received, and at step 904, NoC elements that form part of or are affected by the topological constraints can be projected onto a grid layout by positioning NoC agents, and at step 906, NoC can be generated based on the grid layout and traffic configured to flow through the NoC agents/elements and links there between.

Furthermore, some portions of the detailed description are presented in terms of algorithms and symbolic representations of operations within a computer. These algorithmic descriptions and symbolic representations are the means used by those skilled in the data processing arts to most effectively convey the essence of their innovations to others skilled in the art. An algorithm is a series of defined steps leading to a desired end state or result. In the example implementations, the steps carried out require physical manipulations of tangible quantities for achieving a tangible result.

Moreover, other implementations of the present application will be apparent to those skilled in the art from consideration of the specification and practice of the example implementations disclosed herein. Various aspects and/or components of the described example implementations may be used singly or in any combination. It is intended that the specification and examples be considered as examples, with a true scope and spirit of the application being indicated by the following claims.

What is claimed is:

1. A method, comprising:
   projecting Network on Chip (NoC) elements of a NoC to a grid layout based on specified topological information; and
   automatically generating the NoC from the projection of the NoC elements to the grid layout;
   wherein the projecting NoC elements of the NoC to the grid layout based on the specified topological information comprises:
   projecting a plurality of nodes, a plurality of routers and a plurality of links onto the grid layout based on the specified topological information, wherein the projected plurality of routers, the plurality of nodes, and the plurality of links are disabled;
   selectively enabling ones of the plurality of routers, ones of the plurality of nodes, and ones of the plurality of links on the grid layout based on one or more constraints for one or more layers of the NoC;
   providing NoC agents on enabled ones of the plurality of nodes of the grid layout;
   providing traffic between the provided NoC agents; and
   mapping the traffic to the enabled ones of the plurality of routers and the plurality of links of the NoC.

2. A non-transitory computer readable medium, storing instructions for executing a process, the instructions comprising:
   projecting Network on Chip (NoC) elements of a NoC to a grid layout based on specified topological information; and
   automatically generating the NoC from the projection of the NoC elements to the grid layout;
   wherein the projecting NoC elements of the NoC to the grid layout based on the specified topological information comprises:
   projecting a plurality of nodes, a plurality of routers and a plurality of links onto the grid layout based on the specified topological information, wherein the projected plurality of routers, the plurality of nodes, and the plurality of links are disabled;
   selectively enabling ones of the plurality of routers, ones of the plurality of nodes, and ones of the plurality of links on the grid layout based on one or more constraints for one or more layers of the NoC;
   providing NoC agents on enabled ones of the plurality of nodes of the grid layout providing traffic between the provided NoC agents; and
   mapping the traffic to the enabled ones of the plurality of routers and the plurality of links of the NoC.

* * * * *